(12) United States Patent
Pao et al.

(10) Patent No.: US 12,080,604 B2
(45) Date of Patent: Sep. 3, 2024

(54) GATE-ALL-AROUND SEMICONDUCTOR DEVICE AND METHOD

(71) Applicant: Taiwan Semiconductor Manufacturing Company, Ltd., Hsinchu (TW)

(72) Inventors: Chia-Hao Pao, Hsinchu (TW); Chih-Chuan Yang, Tainan (TW); Shih-Hao Lin, Hsinchu (TW); Kian-Long Lim, Hsinchu (TW); Chih-Wei Lee, Hsinchu (TW); Chien-Yuan Chen, Hsinchu (TW); Jo-Chun Hung, Hsinchu (TW); Yung-Hsiang Chan, Hsinchu (TW); Yu-Kuan Lin, Hsinchu (TW); Lien-Jung Hung, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/362,163

(22) Filed: Jul. 31, 2023

(65) Prior Publication Data
US 2023/0411216 A1    Dec. 21, 2023

Related U.S. Application Data

(63) Continuation of application No. 17/387,636, filed on Jul. 28, 2021, now Pat. No. 11,791,214.
(Continued)

(51) Int. Cl.
*H01L 21/8234* (2006.01)
*H01L 21/8238* (2006.01)
(Continued)

(52) U.S. Cl.
CPC ........... *H01L 21/823431* (2013.01); *H01L 21/823412* (2013.01); *H01L 21/823481* (2013.01);
(Continued)

(58) Field of Classification Search
CPC ..... H01L 21/823412; H01L 21/823431; H01L 21/82345; H01L 21/823481;
(Continued)

(56) References Cited

U.S. PATENT DOCUMENTS 10,510,620 B1 * 12/2019 Chanemougame ......... H01L 27/0924
11,355,601 B2    6/2022 Chiang
(Continued)

*Primary Examiner* — Cheung Lee
(74) *Attorney, Agent, or Firm* — Haynes and Boone, LLP

(57) ABSTRACT

A method includes providing a substrate, a dummy fin, and a stack of semiconductor channel layers; forming an interfacial layer wrapping around each of the semiconductor channel layers; depositing a high-k dielectric layer, wherein a first portion of the high-k dielectric layer over the interfacial layer is spaced away from a second portion of the high-k dielectric layer on sidewalls of the dummy fin by a first distance; depositing a first dielectric layer over the dummy fin and over the semiconductor channel layers, wherein a merge-critical-dimension of the first dielectric layer is greater than the first distance thereby causing the first dielectric layer to be deposited in a space between the dummy fin and a topmost layer of the stack of semiconductor channel layers, thereby providing air gaps between adjacent layers of the stack of semiconductor channel layers and between the dummy fin and the stack of semiconductor channel layers.

20 Claims, 33 Drawing Sheets

Related U.S. Application Data

(60) Provisional application No. 63/188,507, filed on May 14, 2021.

(51) Int. Cl.
*H01L 29/06* (2006.01)
*H01L 29/423* (2006.01)
*H01L 29/66* (2006.01)
*H01L 29/78* (2006.01)
*H01L 29/786* (2006.01)

(52) U.S. Cl.
CPC .. *H01L 21/823821* (2013.01); *H01L 29/0673* (2013.01); *H01L 29/42392* (2013.01); *H01L 29/66742* (2013.01); *H01L 29/6681* (2013.01); *H01L 29/7851* (2013.01); *H01L 29/78696* (2013.01)

(58) Field of Classification Search
CPC ..... H01L 21/823807; H01L 21/823821; H01L 21/823842; H01L 21/823878; H01L 27/088; H01L 27/0886; H01L 27/92; H01L 29/165; H01L 29/42392; H01L 29/513; H01L 29/517; H01L 29/66439; H01L 29/66545; H01L 29/66742; H01L 29/6681; H01L 29/775; H01L 29/7848; H01L 29/7851; H01L 29/78696
See application file for complete search history.

(56) References Cited

U.S. PATENT DOCUMENTS

| | | |
|---|---|---|
| 11,374,128 B2 | 6/2022 | Chen |
| 11,387,346 B2 | 7/2022 | Huang |
| 11,443,987 B2 | 9/2022 | Chen |
| 11,615,962 B2 | 3/2023 | Hsu |
| 2021/0210489 A1 | 7/2021 | Zhang |

\* cited by examiner

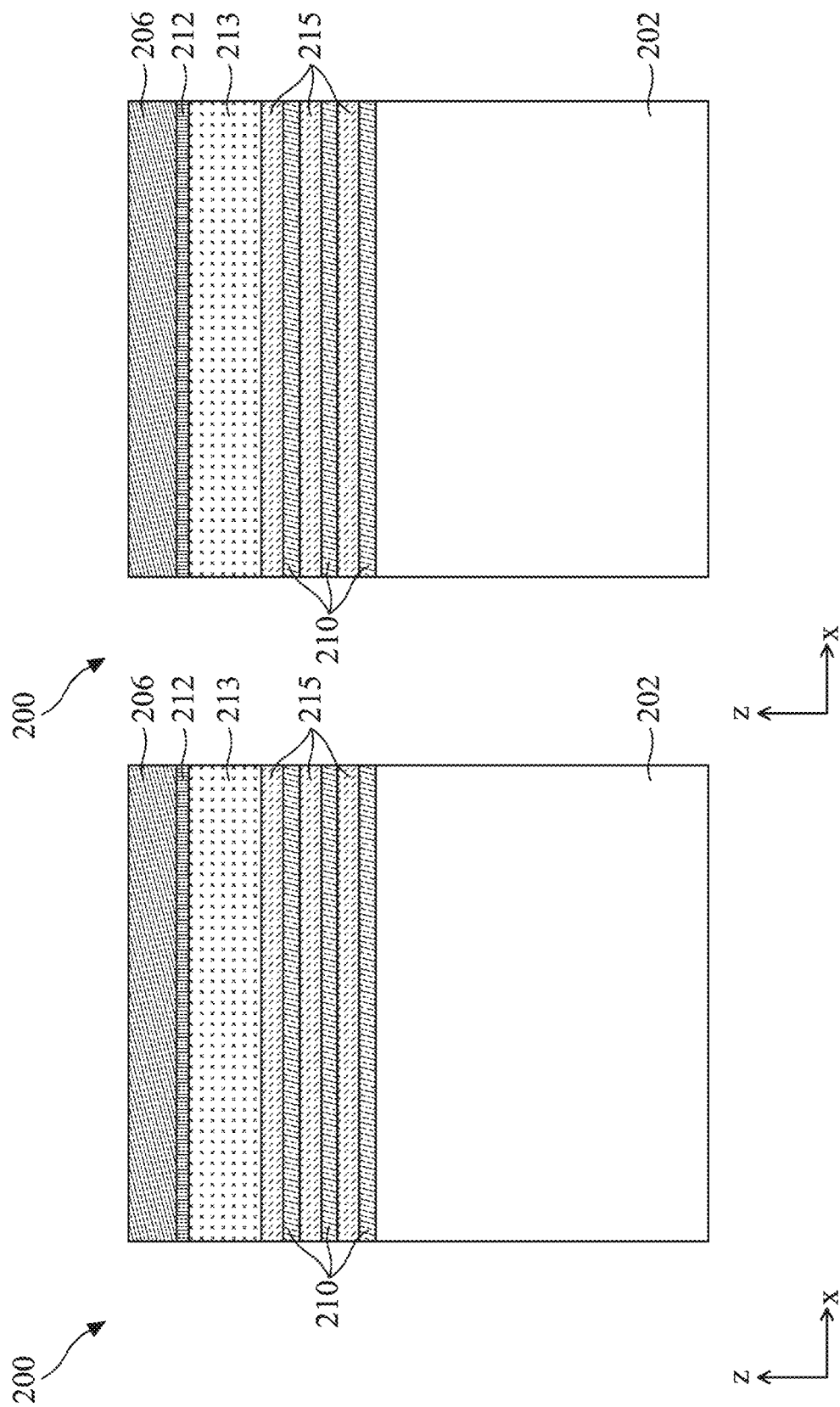

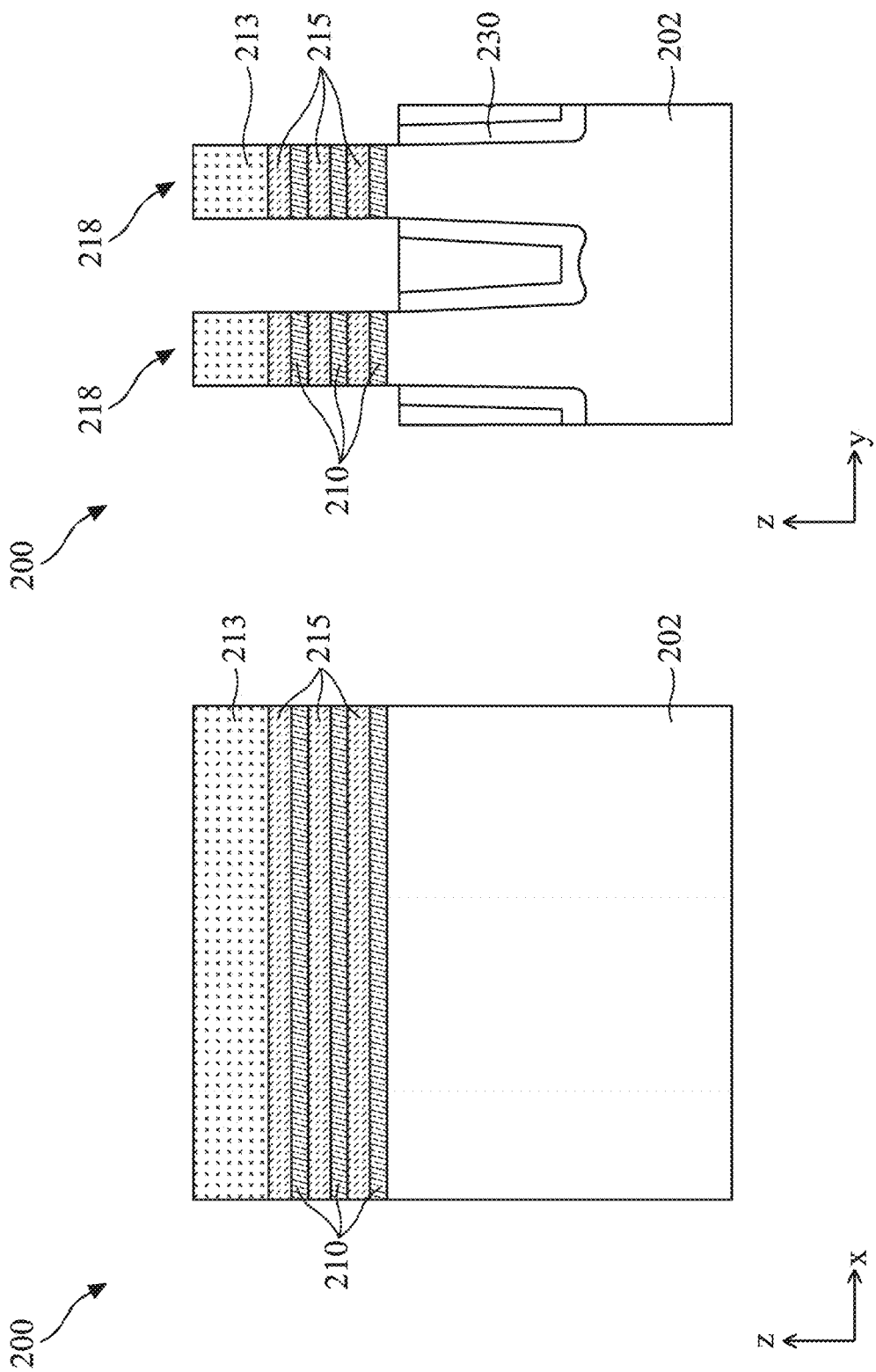

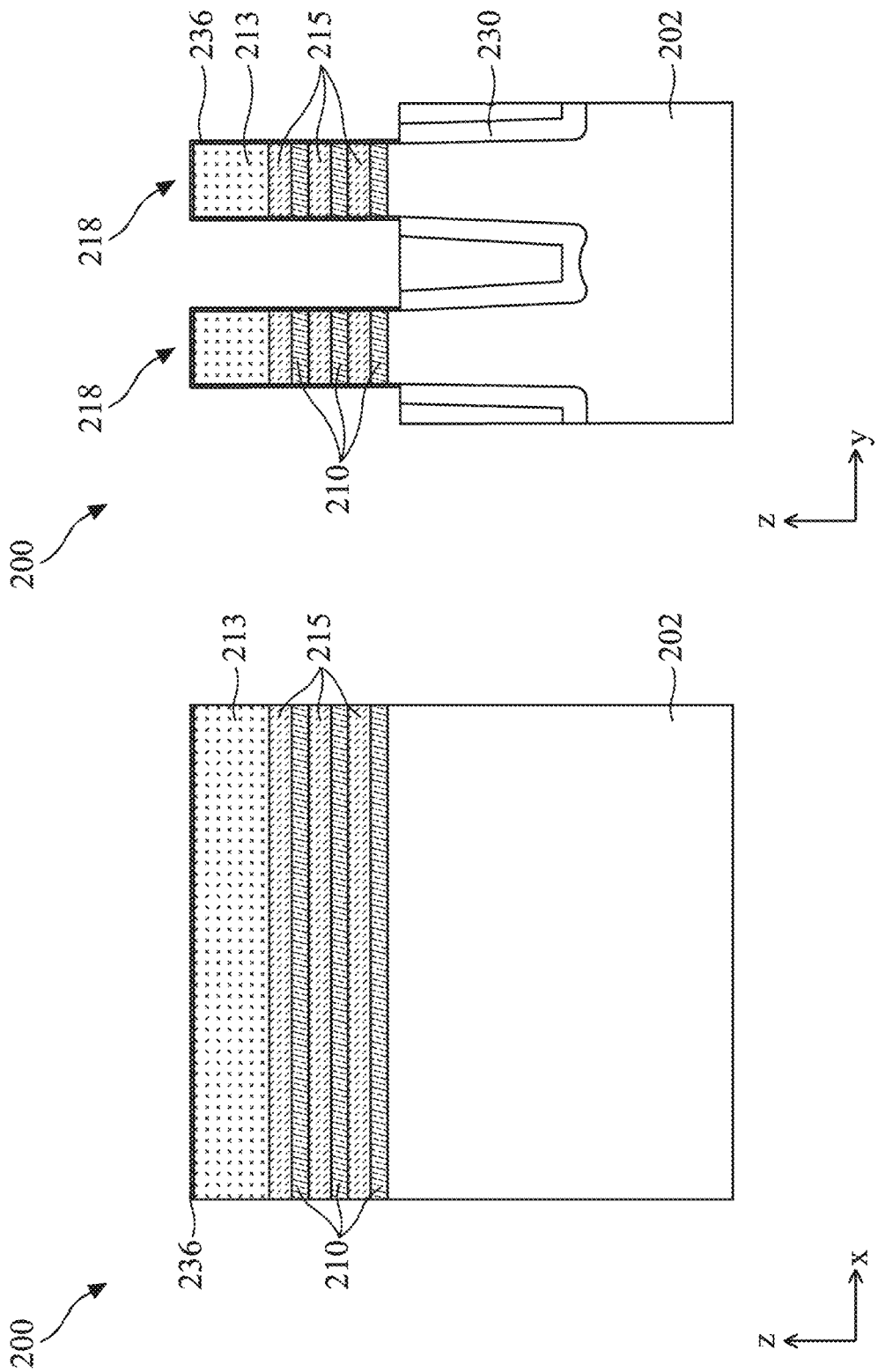

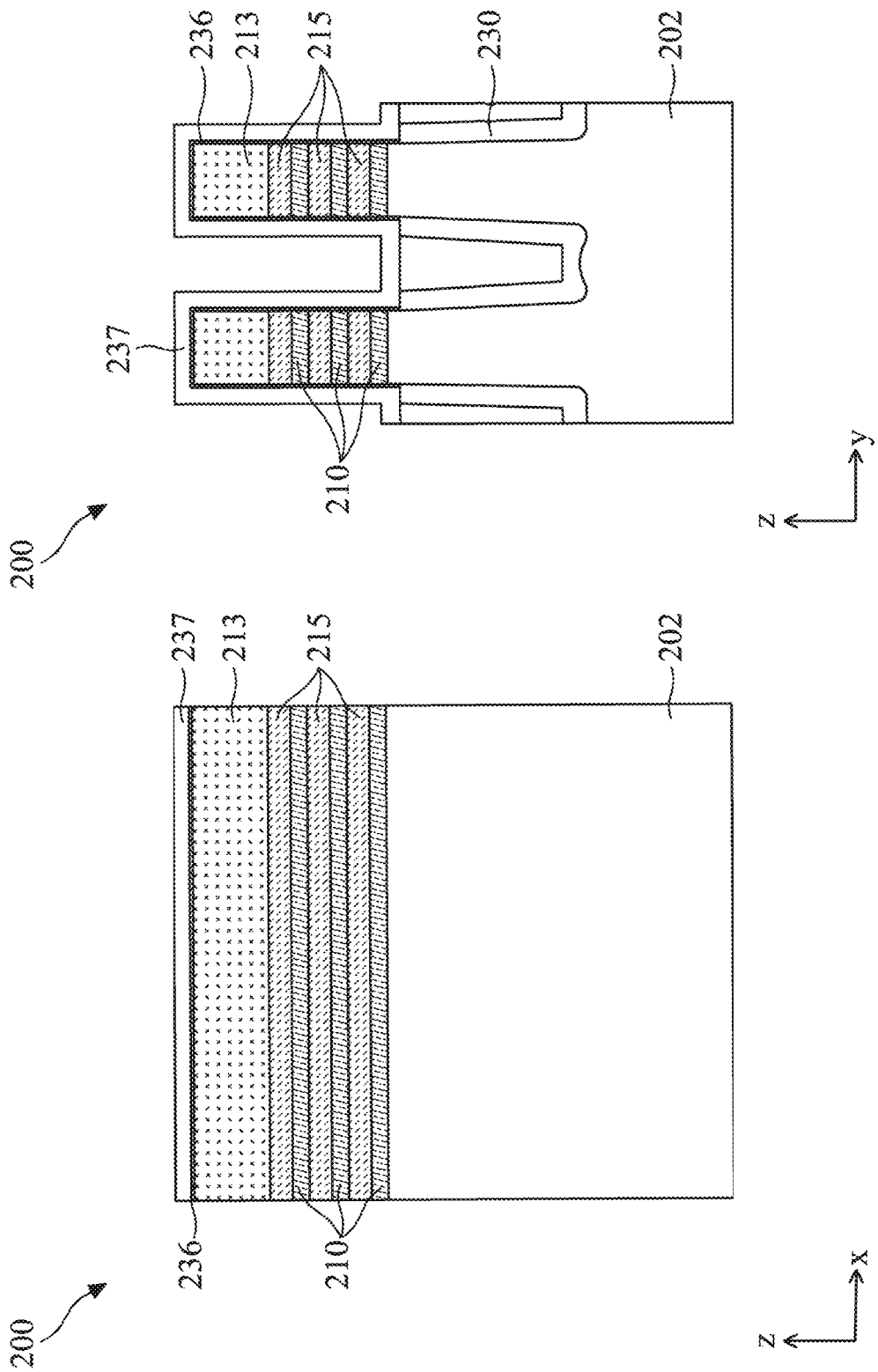

GATE-ALL-AROUND SEMICONDUCTOR DEVICE AND METHOD

PRIORITY

This application is a continuation of U.S. patent application Ser. No. 17/387,636, filed Jul. 28, 2021, which claims the benefit of and priority to U.S. Provisional Application No. 63/188,507, filed May 14, 2021, the entire disclosures of which are herein incorporated by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

GAA devices are a promising candidate to take CMOS to the next stage of the roadmap due to their better gate control ability, lower leakage current, and fully FinFET device layout compatibility. A GAA device refers to a device having vertically-stacked horizontally-oriented multi-channel transistors, such as nanowire transistors and nanosheet transistors. As the vertical space between channels (or sheets) becomes smaller, making GAA devices has become more and more challenging. One issue in making such small GAA devices is how to fill various layers of high-k metal gates in the space vertically between the channels. Accordingly, although existing semiconductor devices (particularly, multi-gate devices) and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 17B, 17C, 18B, 18C, 19B, 19C, 20B, 20C, 21B, 21C, 22B, and 22C are diagrammatic cross-sectional views of a semiconductor device, in portion, at various fabrication stages (such as those associated with the method in FIG. 16) according to various aspects of the present disclosure.

DETAILED DESCRIPTION

Figure 1A:
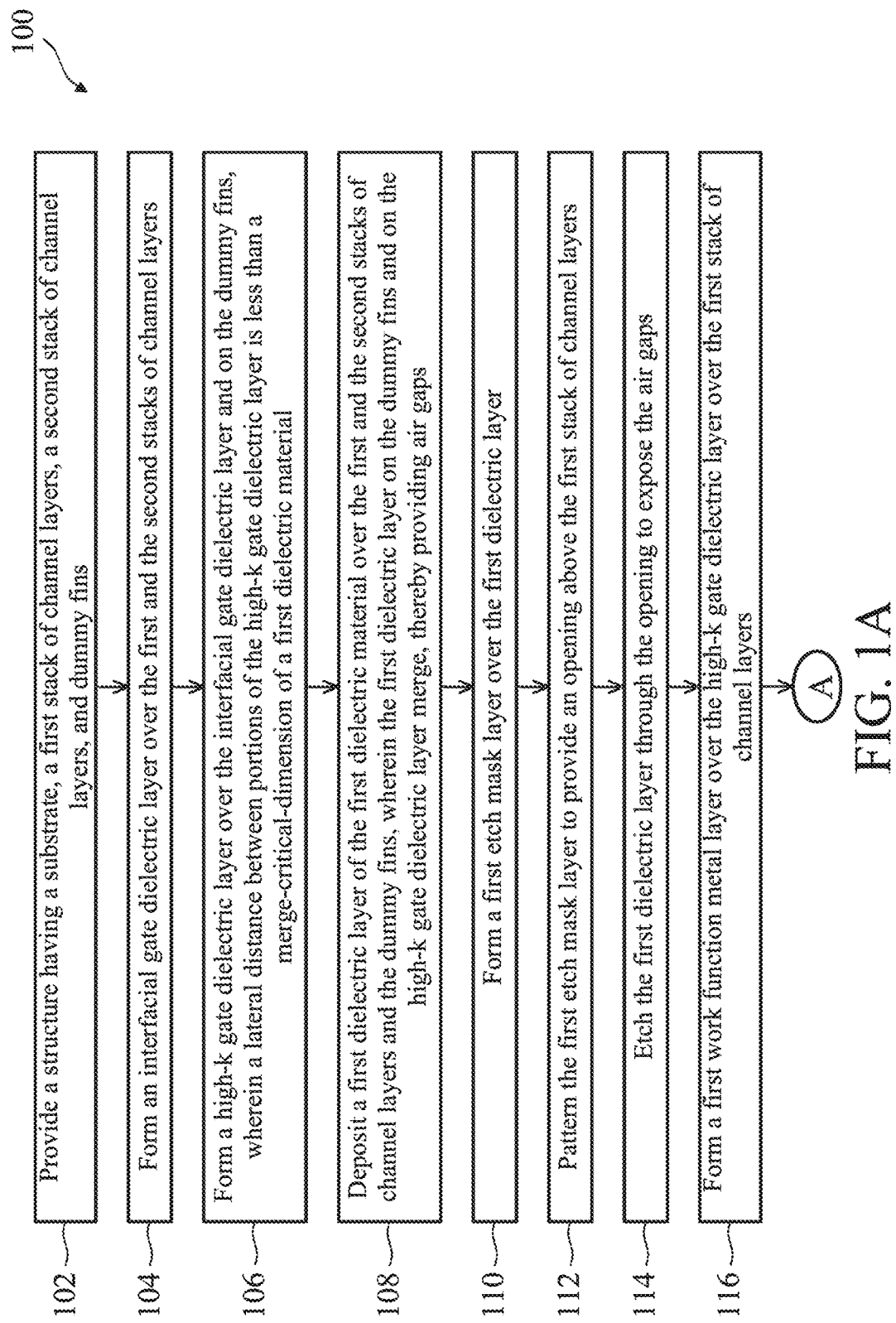
FIGS. 1A and 1B are flow charts of a method for fabricating a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to semiconductor devices such as integrated circuits (IC), and more particularly, to IC devices having GAA devices (or GAA transistors). A GAA device refers to a transistor having vertically-stacked horizontally-oriented multi-channels, such as a nanowire transistor and a nanosheet transistor. GAA devices are promising candidates to take CMOS to the next stage of the roadmap due to their better gate control ability, lower leakage current, and fully FinFET device layout compatibility. Like FinFET devices, GAA devices typically use high-k metal gates (HKMG). To offer GAA transistors with different threshold voltages (such as standard Vt, low Vt, and so on), the HKMG for GAA transistors undergo patterning processes which involve depositing certain material layers for HKMG, forming etch masks, etching the material layers through the etch masks, and removing the etch masks. Through such patterning processes, transistors with different compositions of HKMG, thus different Vts, can be formed.

As the semiconductor fabrication process progresses to smaller geometries, the vertical space between channels (or sheets) of GAA transistors becomes smaller and the horizontal space between channels and nearby structures (such as dummy fins or another GAA transistor) becomes smaller, patterning HKMG for GAA devices has become more and more challenging. For example, forming the etch masks for HKMG patterning may require stringent process control. In some approaches, a hard mask layer is formed as a part of an etch mask. The thickness of the hard mask layer is controlled such that it merges vertically between the channels of GAA transistors while at the same time it does not merge horizontally between the channels and a nearby structure such as a dummy (dielectric) fin. Such approach is doable but requires a stringent process control.

The present disclosure utilizes a method that requires a less stringent process control than the above approaches. In an embodiment of the present disclosure, the channels of GAA transistors are formed with increased widths from a bottom channel to the topmost channel. The horizontal distance between the topmost channel and a nearby dummy fin is controlled such that it is smaller than twice of the thickness of a hard mask layer. As a result, the hard mask layer is only deposited at the top of the topmost channel and between the topmost channel and the nearby dummy fin, and the hard mask layer is not deposited in the space vertically between the channels. This makes the patterning processes easier to implement. The details of the fabrication methods and the structures of the present disclosure are described by referring to the accompanied figures.

Figure 1B:
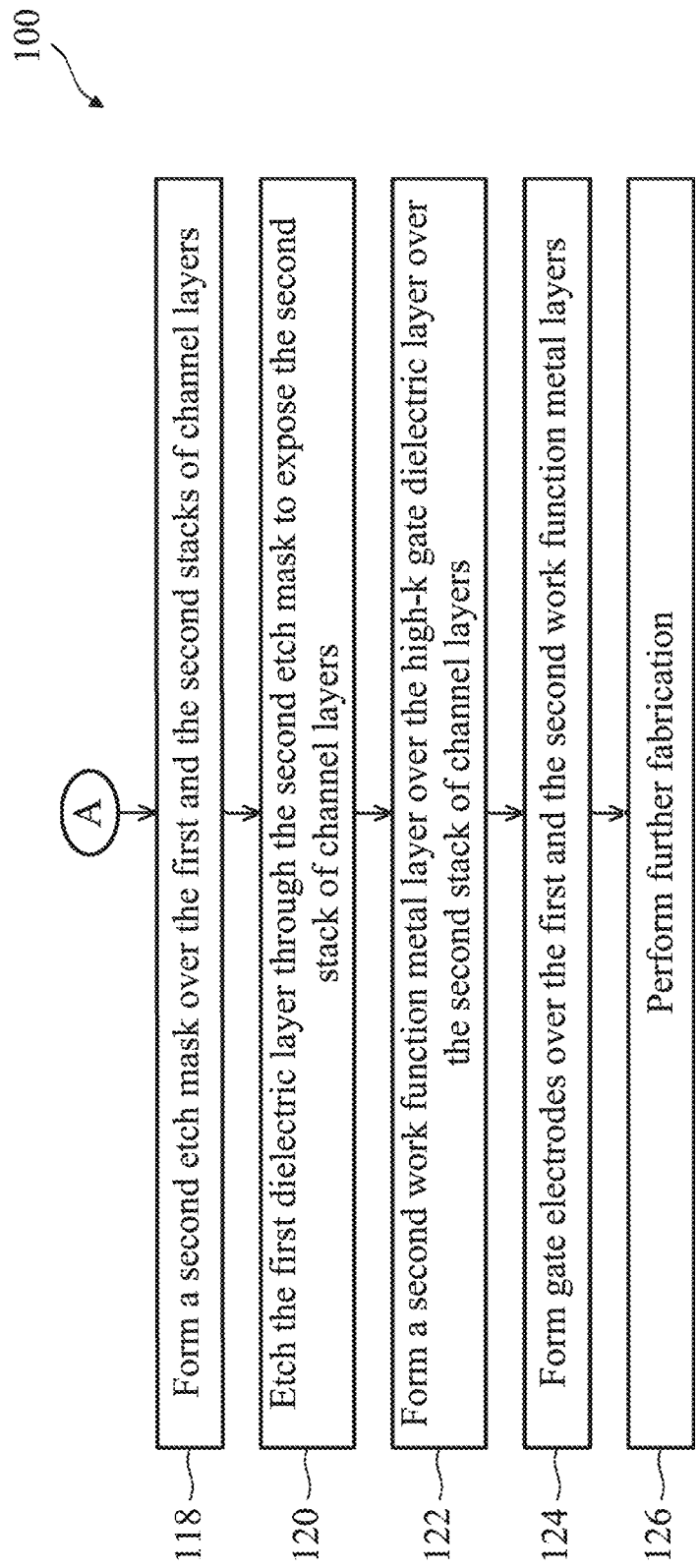
Figure 2A:
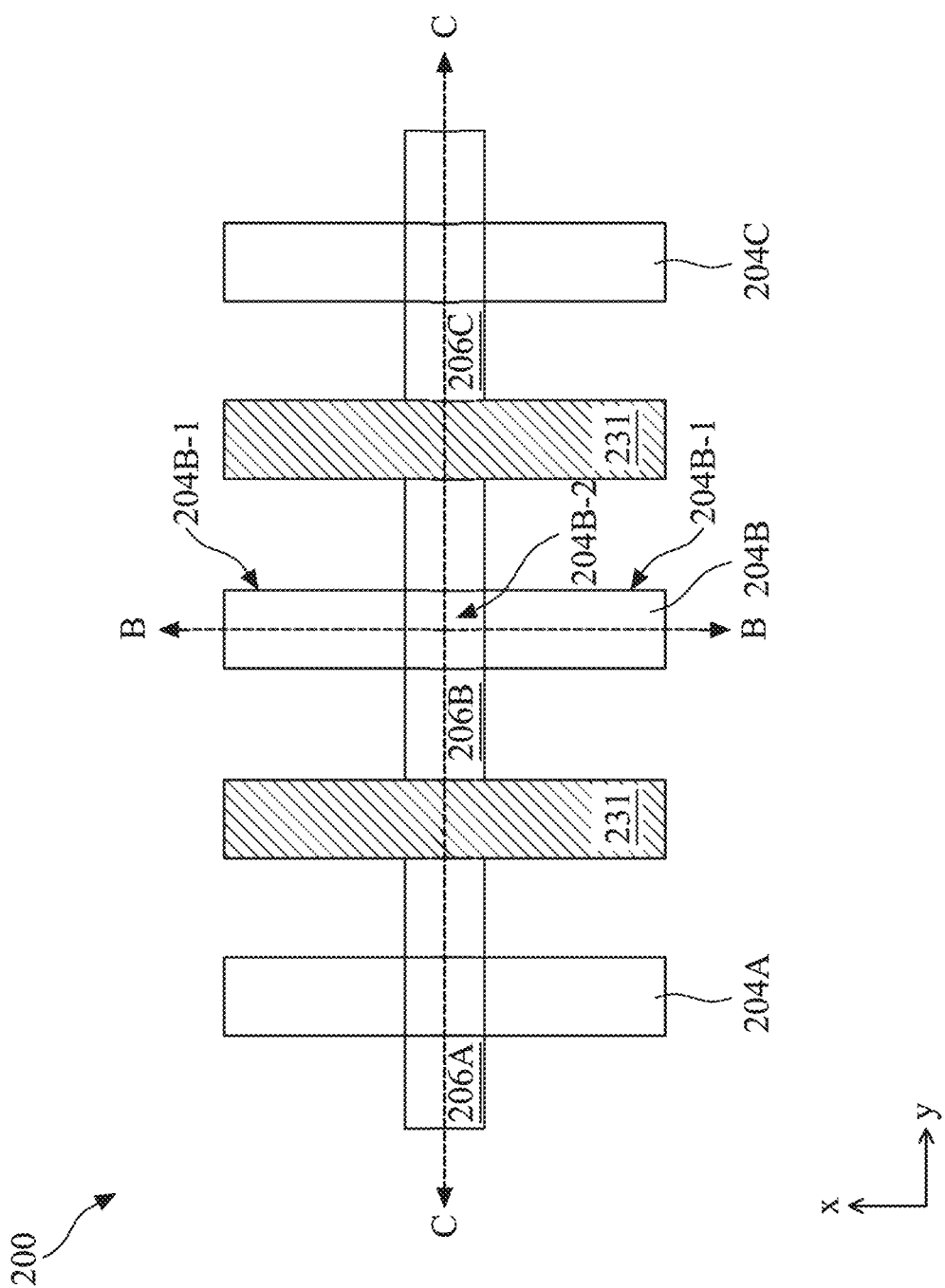
FIG. 2A is a diagrammatic top view of a semiconductor device, in portion, according to various aspects of the present disclosure.

FIGS. 1A and 1B are flow charts of a method 100 for fabricating a semiconductor device 200 (or simply, device 200) according to various aspects of the present disclosure. In some embodiments, the method 100 fabricates a semiconductor device that includes GAA transistors. Additional processing is contemplated by the present disclosure. Additional steps can be provided before, during, and after the method 100, and some of the steps described below can be moved, replaced, or eliminated for additional embodiments of the method 100. The method 100 is described below in conjunction with FIGS. 2A through 15. FIG. 2A is a diagrammatic top view of the device 200, in portion, at a fabrication stage associated with method 100 according to various aspects of the present disclosure. FIGS. 2B-15 are diagrammatic cross-sectional views of the device 200, in portion, at various fabrication stage associated with method 100 according to various aspects of the present disclosure.

The device 200 is a multi-gate (or multigate) device in the present embodiments, and may be included in a microprocessor, a memory, and/or other IC devices. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 2A-15 have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

Figure 2B:
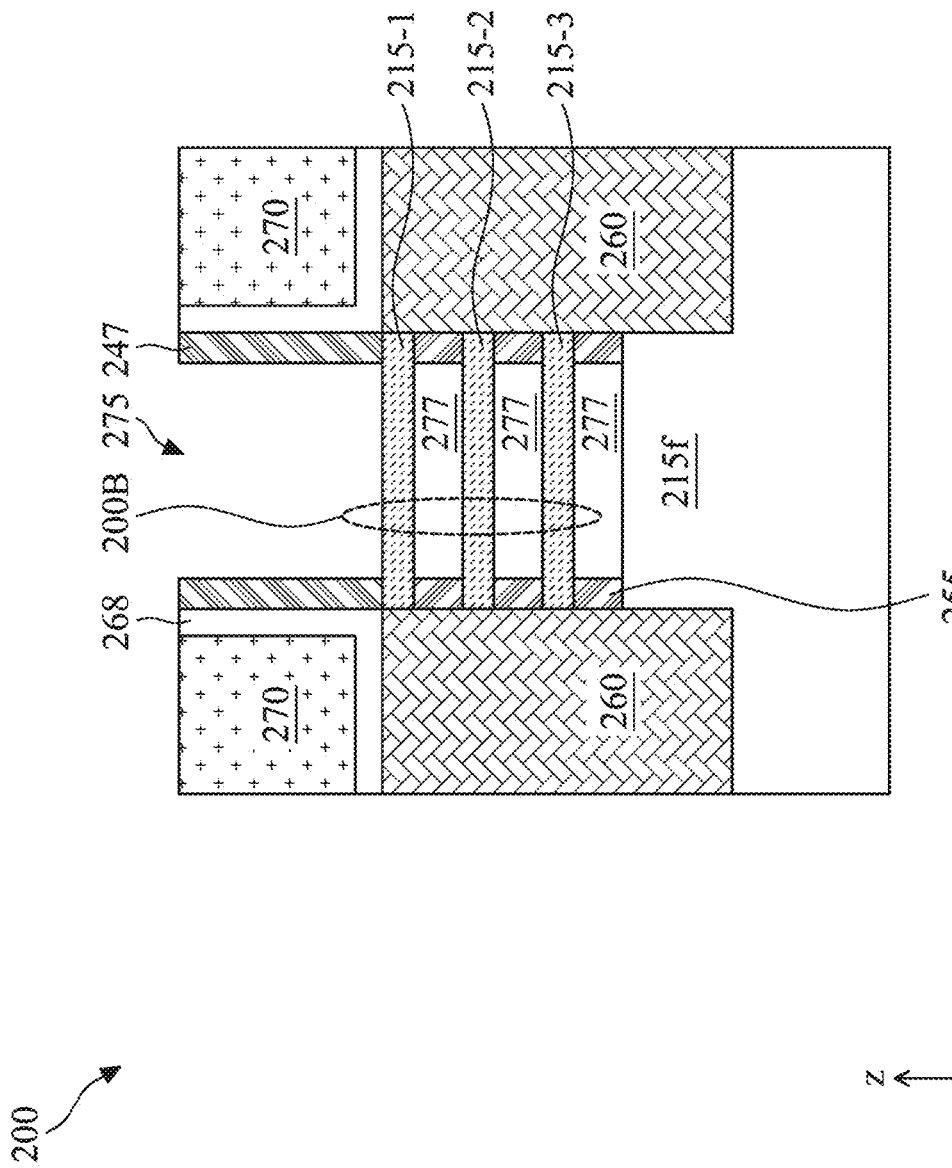
FIGS. 2B and 2C are diagrammatic cross-sectional views of the semiconductor device in FIG. 2A, in portion, according to an embodiment of the present disclosure.
Figure 2C:
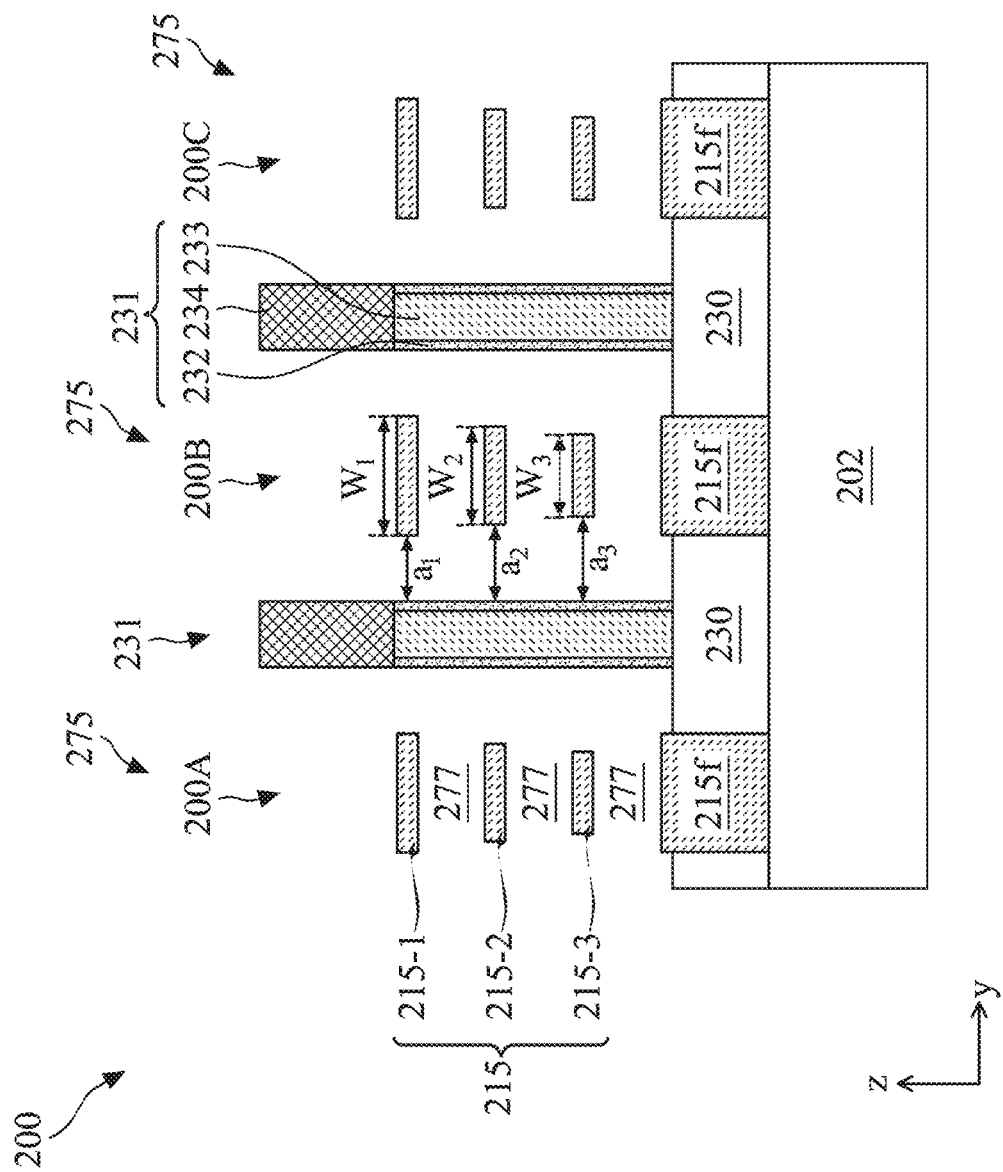

At operation 102, the method 100 (FIG. 1A) provides or is provided with an initial structure of the device 200, a portion of which is shown in FIGS. 2A-2C according to an embodiment. Particularly, FIG. 2A illustrates that the device 200 includes active regions 204A, 204B, and 204C and gate regions 206A, 206B, and 206C which are generally perpendicular to the active regions 204A, 204B, and 204C, respectively. Each active region 204A-C includes a pair of source/drain (S/D) regions and a channel region between the pair of S/D regions. For example, the active region 204B includes a pair of source/drain (S/D) regions 204B-1 and a channel region 204B-2 between the pair of S/D regions 204B-1. Each gate region 206A-C engages the channel region of the respective active region 204A-C. For example, the gate region 206B engages the channel region 204B-2 of the active region 204B. The device 200 further includes dummy fins 231 (or dielectric fins 231) that are oriented lengthwise (along the x direction) generally parallel to the active regions and between the active regions.

FIG. 2B illustrates a cross-sectional view of the device 200 along the B-B line of FIG. 2A according to an embodiment. FIG. 2C illustrates a cross-sectional view of the device 200 along the C-C line of FIG. 2A according to an embodiment. The embodiments illustrated in FIGS. 2B and 2C are nanosheet FETs, where their channel layers 215 are in the shape of nano-sized sheets. In some alternative embodiments, the channel layers 215 are in the shape of nano-sized wires or nano-sized rods.

Referring to FIG. 2B, the device 200 includes a substrate (such as a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate.

The device 200 further includes a pair of source/drains (S/D) 260, each S/D being located in an S/D region. For n-type transistors, the S/D 260 are of n-type doped. For p-type transistors, the S/D 260 are of p-type doped. The S/D 260 may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. The S/D 260 are doped with proper n-type dopants and/or p-type dopants. For example, for n-type transistors, the S/D 260 may include silicon and be doped with carbon, phosphorous, arsenic, other n-type dopant, or combinations thereof; and for p-type transistors, the S/D 260 may include silicon germanium or germanium and be doped with boron, other p-type dopant, or combinations thereof.

Referring to FIGS. 2B-2C, the device 200 further includes semiconductor fins 215f protruding from the upper surface of the substrate 202, and stacks of semiconductor layers 215 suspended over the semiconductor fins 215f. The semiconductor fins 215f and the stacks of semiconductor layers 215 are in the channel regions of the active regions 204A-C and connecting the pair of the S/D 260 in the respective active region. Particularly, the depicted embodiment illustrates three stacks 200A, 200B, and 200C of semiconductor layers 215 that are located in the active regions 204A, 204B, and 204C, respectively. The stack of semiconductor layers 215 serve as the transistor channels for the respective GAA transistors. Accordingly, the semiconductor layers 215 are also referred to as channel layers 215.

In the depicted embodiment, each of the stacks 200A, 200B, and 200C includes three channel layers 215. In an alternative embodiment, each of the stacks 200A, 200B, and 200C may include more than three channel layers 215, such as up to 10 channel layers 215. For convenience, the channel layers 215 are labeled as 215-1, 215-2, and 215-3 from top to bottom. The cross-sectional view of FIG. 2C shows that the channel layers 215 extend widthwise along the y direction and their widths $w_3$, $w_2$, $w_1$, increase as they are further away from the upper surface of the substrate 202 (i.e., $w_3 < w_2 < w_1$). In other words, the channel layer 215-1 is wider than the channel layer 215-2 which is wider than the channel layer 215-3. An embodiment of forming the channel layers 215 with the varied widths will be further discussed with reference to FIG. 16. As a result, the space between the channel layers 215 and the nearby dummy fins 231 become narrower as it is further away from the upper surface of the substrate 202. In other words, the horizontal distance $a_3$, $a_2$, $a_1$ between the channel layers 215 and the nearby dummy fins 231 decrease as they are further away from the upper surface of the substrate 202 (i.e., $a_3 > a_2 > a_1$). As will be discussed, such configuration provides advantages when performing HKMG patterning processes. For example, only the dimension $a_1$ is a critical dimension to be controlled while the dimensions $a_2$, $a_3$, and the vertical spacing 277 (or gap 277) become less critical. The lengthwise direction of the semiconductor fins 215f and the channel layers 215 extend into the page of FIG. 2C (which is the x direction in FIG. 2B).

The channel layers 215 are exposed in gate trenches 275 which are resulted from the removal of a dummy gate from the respective gate regions 206A-C therein. The channel layers 215 may include single crystalline silicon. Alternatively, the channel layers 215 may include germanium, silicon germanium, or another suitable semiconductor material(s). Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and connecting the respective S/D 260. The channel layers 215 are separated from each other and from the substrate 202 by gaps 277.

In some embodiments, each channel layer 215 has nanometer-sized dimensions, thus may be referred to as nanostructures. For example, each channel layer 215 may have a length (along the "x" direction) about 10 nm to about 300 nm, and a width (along the "y" direction) about 10 nm to about 50 nm, and a height or thickness (along the "z" direction) about 4 nm to about 8 nm in some embodiments. The vertical spacing 277 (along the "z" direction) between the channel layers 215 may be about 7 nm to about 20 nm in some embodiments. Thus, the channel layer 215 can be referred to as a "nanowire" or "nanosheet" which generally refers to a channel layer suspended in a manner that will allow a high-k metal gate to physically wrap around the channel layer. In some embodiments, the channel layers 215 may be cylindrical-shaped (e.g., nanowire), rectangular-shaped (e.g., nanobar), sheet-shaped (e.g., nanosheet), or have other suitable shapes.

Referring to FIG. 2C, the device 200 further includes an isolation structure 230 to isolate various regions, such as the various active regions 204A-C. Isolation structure 230 includes silicon oxide, silicon nitride, silicon oxynitride, other suitable isolation material (for example, including silicon, oxygen, nitrogen, carbon, or other suitable isolation constituent), or combinations thereof. Isolation structure 230 can include different structures, such as shallow trench isolation (STI) structures, deep trench isolation (DTI) structures, and/or local oxidation of silicon (LOCOS) structures. Isolation structure 230 can include multiple layers of insulating materials.

Referring to FIG. 2B, the device 200 further includes gate spacers 247 adjacent to the S/D 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the S/D 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255 along the "x" direction.

The device 200 further includes a contact etch stop layer (CESL) 268 disposed over the isolation structure 230, the S/D 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-level dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

Referring to FIG. 2C, the dummy fins 231 are disposed over the isolation structure 230. In the embodiment depicted in FIG. 2C, the dummy fins 231 include a dielectric liner layer 232, a dielectric fill layer 233 over the dielectric liner layer 232, and a dielectric helmet 234 over the dielectric layers 232 and 233. In an embodiment, the dielectric liner layer 232 includes a low-k dielectric material such as a dielectric material including Si, O, N, and C. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, lower than that of silicon oxide (k≈3.9). The dielectric liner layer 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric helmet 234 is formed by any of the processes described herein, such as ALD, CVD, PVD, oxidation-based deposition process, other suitable process, or combinations thereof. The gate trenches 275 are provided between opposing dummy fins 231 along the "y" direction.

Figure 3:
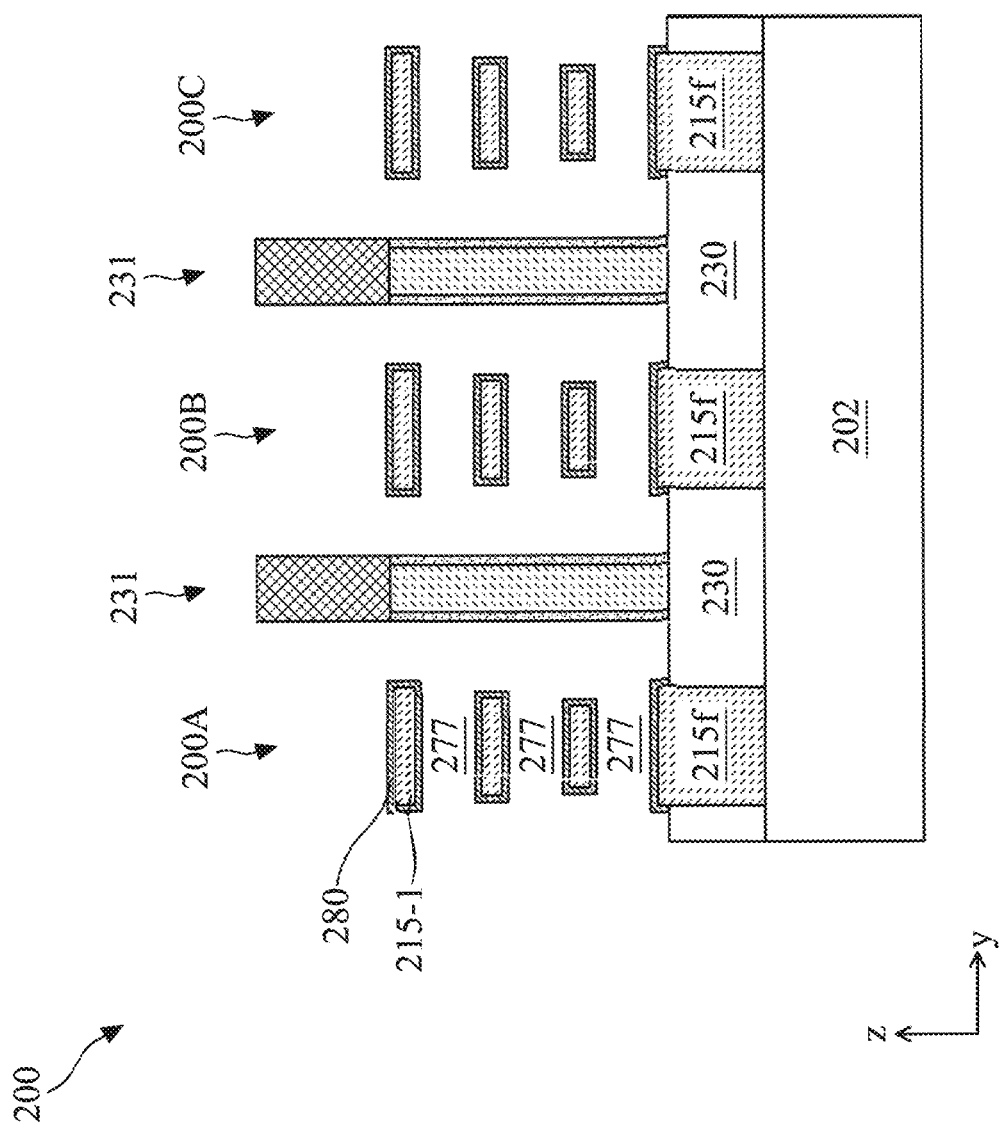
FIGS. 3, 4, 5, 6, 7, 8, 9, 10, 11, 12, 13, 14, and 15 are diagrammatic cross-sectional views of a semiconductor device, in portion, at various fabrication stages (such as those associated with the method in FIGS. 1A and 1B) according to various aspects of the present disclosure.

At the operation 104, the method 100 (FIG. 1A) forms an interfacial gate dielectric layer (or simply, interfacial layer) 280 on the surfaces of the channel layers 215 that are exposed in the gate trenches 275, such as shown in FIG. 3. FIGS. 3 through 15 illustrate cross-sectional views of the device 200 along the C-C line of FIG. 2A. Turning to FIG. 3, the interfacial layer 280 wraps around each of the channel layers 215 and partially fills the gaps 277. In the present embodiment, the interfacial layer 280 is disposed on the semiconductor surfaces exposed in the gate trenches 275 such as the surfaces of the channel layers 215 and the semiconductor fin 215f, but not on the dielectric surfaces exposed in the gate trenches 275 such as the surfaces of the isolation structure 230, the gate spacers 247, and the dummy fins 231. For example, the interfacial layer 280 may be formed by an oxidation process (such as thermal oxidation or chemical oxidation) where the semiconductor surfaces react with oxygen to form a semiconductor oxide as the interfacial layer 280. In such oxidation process, the dielectric surfaces do not react with the oxygen, thus, the interfacial layer 280 is not formed thereon. In an alternative embodiment, the interfacial layer 280 is disposed not only on the channel layers 215 and the semiconductor fin 215f, but also on the isolation structure 230, the gate spacers 247, and the dummy fins 231, for example, by using atomic layer deposition (ALD) or other suitable deposition methods. The interfacial layer 280 includes a dielectric material, such as $SiO_2$, HfSiO, SiON, other silicon-containing dielectric material, other suitable dielectric material, or combinations thereof. In some embodiments, the interfacial layer 280 has a thickness of about 5 Å to about 15 Å. If the interfacial layer 280 is too thin (such as less than 5 Å), its reliability might be poor in some cases. If the interfacial layer 280 is too thick (such as more than 15 Å), the remaining portion of the gaps 277 might be too small to have a high-k dielectric layer and a work function metal layer to fill therein in some cases.

Figure 4:
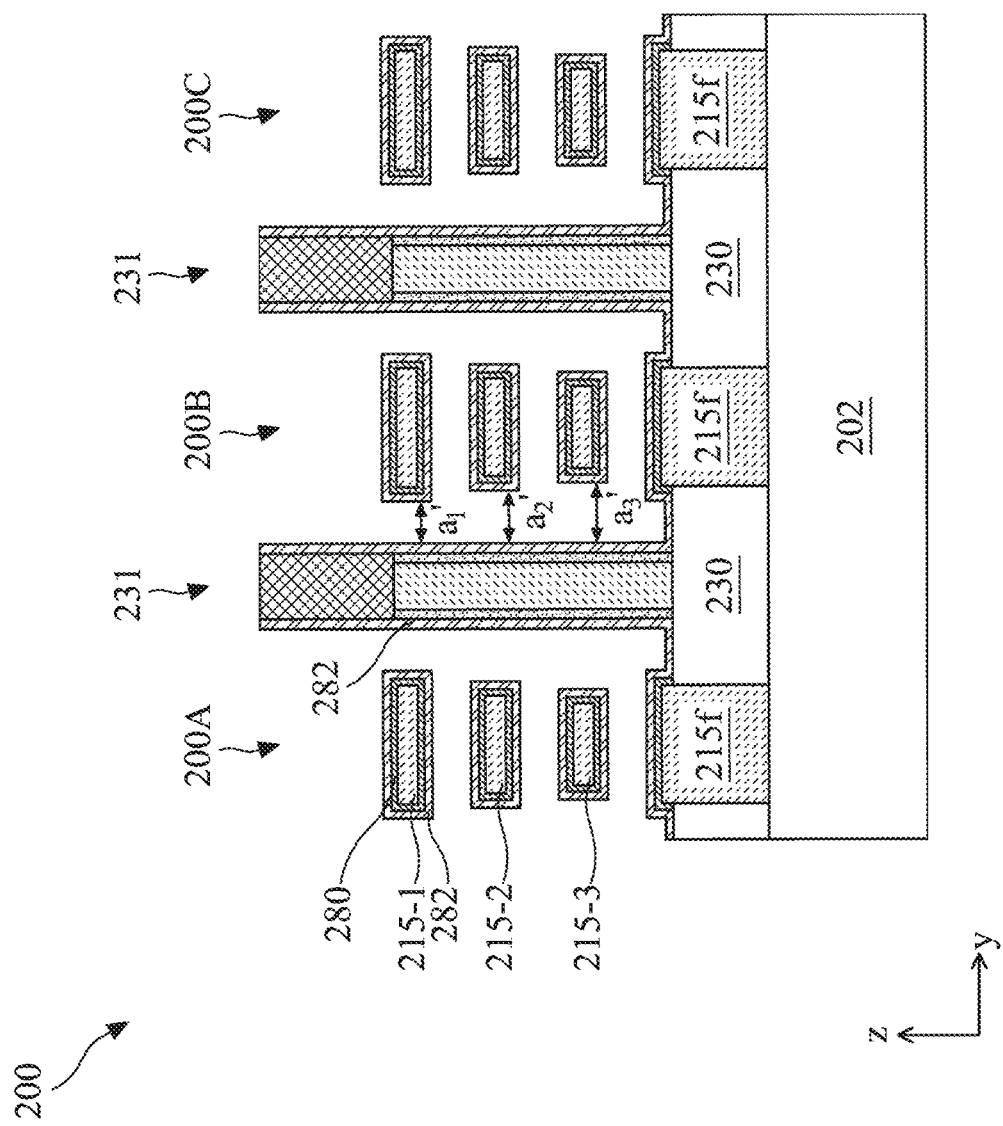

At the operation 106, the method 100 (FIG. 1A) forms a high-k gate dielectric layer (or simply, high-k dielectric layer) 282 over the interfacial layer 280 and over other structures exposed in the gate trenches 275, such as shown in FIG. 4. Turning to FIG. 4, the high-k dielectric layer 282 is disposed over the interfacial layer 280 and wraps around each of the channel layers 215. The high-k dielectric layer 282 and the interfacial layer 280 collectively partially fill the gaps 277. In the present embodiment, the high-k dielectric layer 282 is also disposed on the isolation structure 230, the gate spacers 247, and the dummy fins 231. For example, the high-k dielectric layer 282 is disposed directly on the isolation structure 230, the gate spacers 247, and the dummy fins 231 in an embodiment. The high-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. The high-k dielectric layer 282 is formed by any of the processes described herein, such as ALD, CVD, PVD, oxidation-based deposition process, other suitable process, or combinations thereof. In some embodiments, the high-k dielectric layer 282 has a thickness of about 1 nm to about 2 nm.

In the present embodiment, the portion of the high-k dielectric layer 282 on the sidewalls of the dummy fins 231 and the portion of the high-k dielectric layer 282 on the channel layers 215-1, 215-2, and 215-3 are spaced by horizontal distance $a_1'$, $a_2'$, and $a_3'$, respectively. Effectively, the horizontal distance $a_1'$, $a_2'$, and $a_3'$ are smaller than the horizontal distance $a_1$, $a_2$, and $a_3$ (FIG. 2C) by the sum of the thickness of the interfacial layer 280 and twice of the thickness of the high-k dielectric layer 282. Thus, it remains true that $a_1'<a_2'<a_3'$ in the present embodiment. Further, the distance $a_1'$ is less than a merge-critical-dimension (or merge-CD) of a dielectric material. In other words, when the dielectric material is deposited (for example, using CVD) over the high-k dielectric layer 282, the distance $a_1'$ is so small that the dielectric material disposed over the sidewalls of the dummy fins 231 and the dielectric material disposed over the stacks 200A-C of channel layers will merge and consequently the dielectric material will not be deposited into the space indicated with $a_2'$ and $a_3'$. In various embodiments, each of the distances $a_1'$, $a_2'$, and $a_3'$ may be in a range from about 10 nm to about 16 nm.

Figure 5:
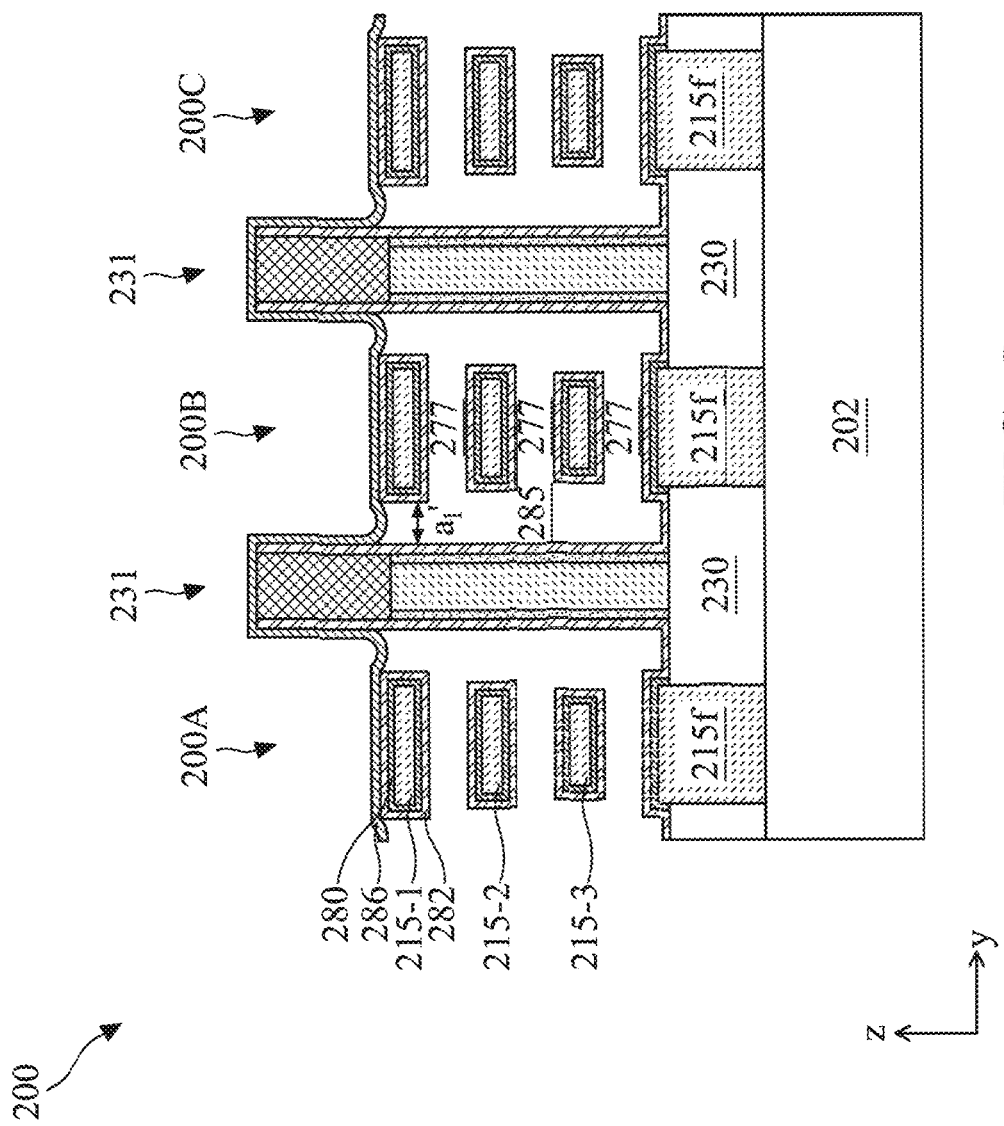

Referring to FIG. 1A, at operation 108, the method 100 forms a dielectric layer 286 over the high-k dielectric layer 282 such as shown in FIG. 5 according to an embodiment. Referring to FIG. 5, the dielectric layer 286 is deposited over the dummy fins 231 and the over the stacks 200A-C of the channel layers 215. In the present embodiment, the material of the dielectric layer 286, the deposition conditions thereof, and the distance $a_1'$ are designed such that the distance $a_1'$ is less than a merge-CD of the dielectric layer 286. As depicted in FIG. 5, the portion of the dielectric layer 286 on the sidewalls of the dummy fin 231 and the portion of the dielectric layer 286 on the channel layer 215-1 merge in the space indicated by $a_1'$. As a result, the dielectric layer 286 is not deposited in the space 277 and is not deposited in the space 285 horizontally between the lower channel layers 215-2 and 215-3 and the dummy fins 231. The vertical space 277 and the horizontal space 285 collectively form air gaps under the dielectric layer 286. In an embodiment, the dielectric layer 286 includes a metal oxide such as alumina ($Al_2O_3$) and is deposited using a CVD method, such as plasma enhanced chemical vapor deposition (PECVD) process. In various embodiments, the dielectric layer 286 may include silicon nitride, lanthanum oxide, silicon (such as polysilicon), silicon carbonitride, silicon oxy carbonitride, aluminum nitride, aluminum oxynitride, a combination thereof, or other suitable materials. In some embodiments, the dielectric layer 286 may be deposited using ALD, CVD, a thermal process (such as a furnace process), a PVD process, or other suitable processes, and may be deposited at a temperate in a range of about 100° C. to about 400° C. and pressure in a range of about 1 torr to 100 torr.

In some approaches where the horizontal distance $a_1'$ is greater than the merge-CD of the dielectric layer 286, the dielectric layer 286 would be deposited into the space 277 and 285. In those cases, the process might be tightly controlled such that the dielectric layer 286 would completely fill the vertical space 277 (so that a later deposited BARC layer would not be in the space 277, which would be difficult to remove otherwise), yet it would not completely fill the horizontal space 285. Those approaches would generally need tighter process control than the present embodiment. Furthermore, in those approaches, it might be difficult to completely remove the dielectric layer 286 during HKMG patterning process. For example, it might be difficult to completely remove the dielectric layer 286 from the space 277 between the channel layer 215-3 and the semiconductor fin 215f and might leave residues of the dielectric layer 286 there, causing manufacturing defects. In contrast, in the present embodiment, since the horizontal distance $a_1'$ is less than the merge-CD of the dielectric layer 286, the dielectric layer 286 is not deposited into the space 277 and 285, which obviates the tight process control and potential manufacturing defects associated with the other approaches.

Figure 6:
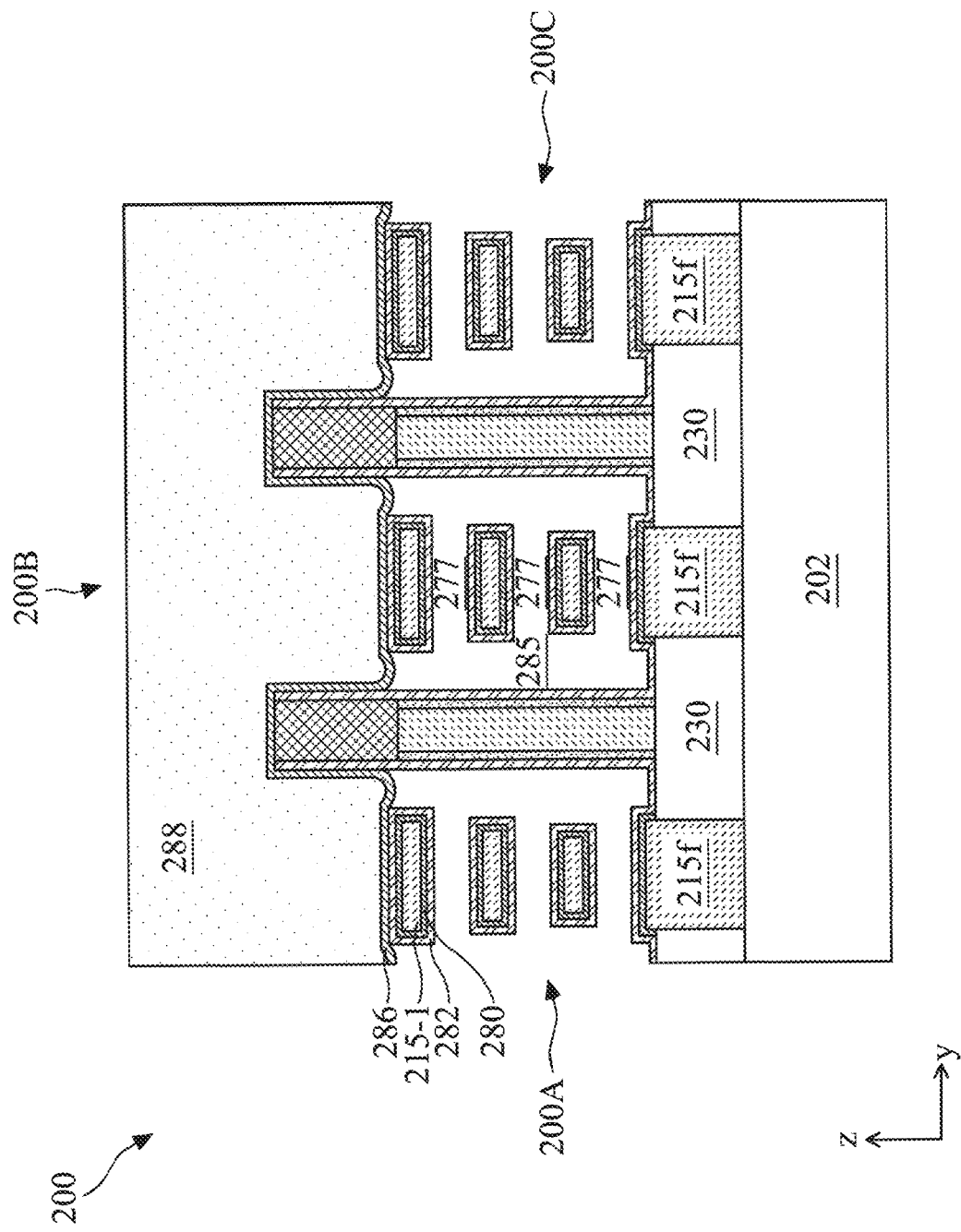
Figure 7:
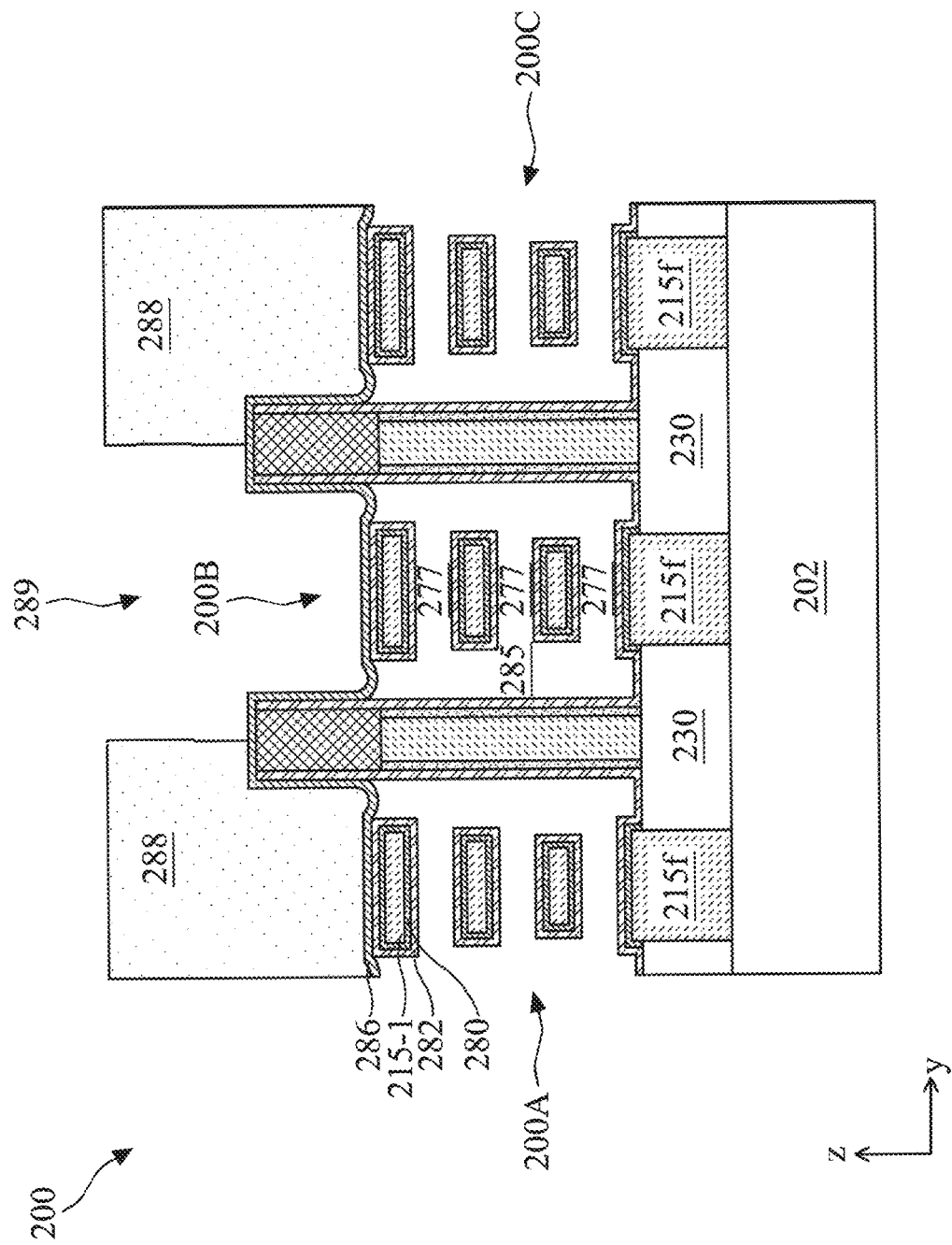

At operation 110, the method 100 (FIG. 1A) forms an etch mask layer 288 over the device 200, particularly over the dielectric layer 286, such as shown in FIG. 6 according to an embodiment. For example, the etch mask layer 288 may include a bottom anti-reflective coating (BARC) material that provides a platform for photoresist coating and photoresist patterning, as well as provides etch selectivity with respect to the dielectric layer 286. In an embodiment, the etch mask layer 288 is formed by spin coating a BARC material over the dielectric layer 286 and baking the BARC material (for example, at a temperature in a range about 100° C. to about 200° C.) to cause cross-linking within the BARC material.

At operation 112, the method 100 (FIG. 1A) patterns the etch mask layer 288 to form openings 289 above some of the stacks 200A-C. In the example shown in FIG. 7, the opening 289 is formed above the stack 200B while the rest of the etch mask layer 288 still covers the stacks 200A and 200C. In other words, the opening 289 exposes the dielectric layer 286 above the stack 200B. In an embodiment, the operation 112 applies a lithography process that includes forming a resist (or photoresist) layer over the etch mask layer 288 by spin coating, performing a pre-exposure baking process, performing an exposure process, performing a post-exposure baking process, and developing the exposed resist layer in a developer solution. After the development, the resist layer becomes a resist pattern that corresponds with the photomask. The exposure process can be implemented using a photomask or using a maskless lithography process such as e-beam writing, ion-beam writing, or combinations thereof. Using the resist pattern as an etch mask, the operation 112 etches the etch mask layer 288 (for example, using an anisotropic etching process) to form the opening 289.

Figure 8:
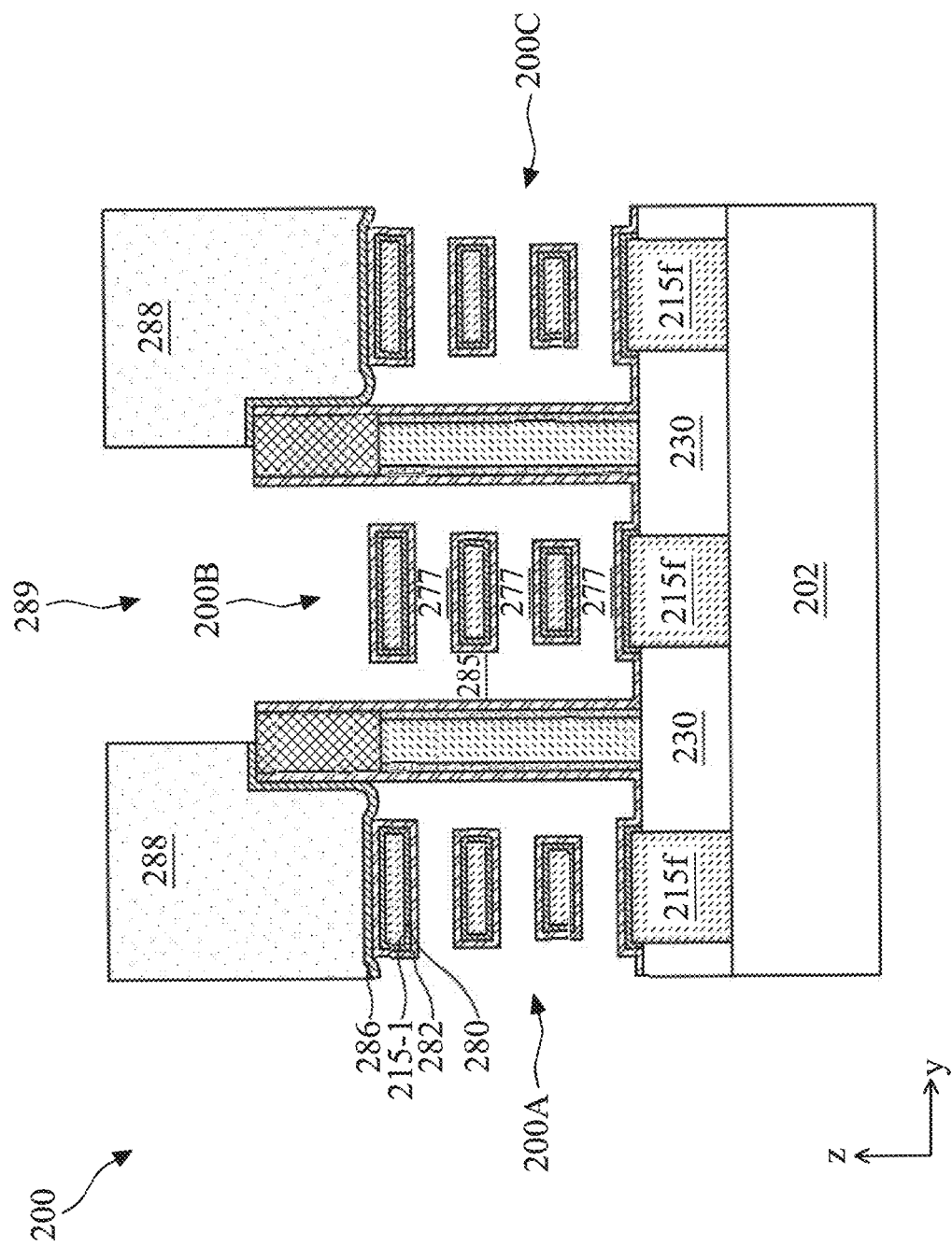
Figure 9:
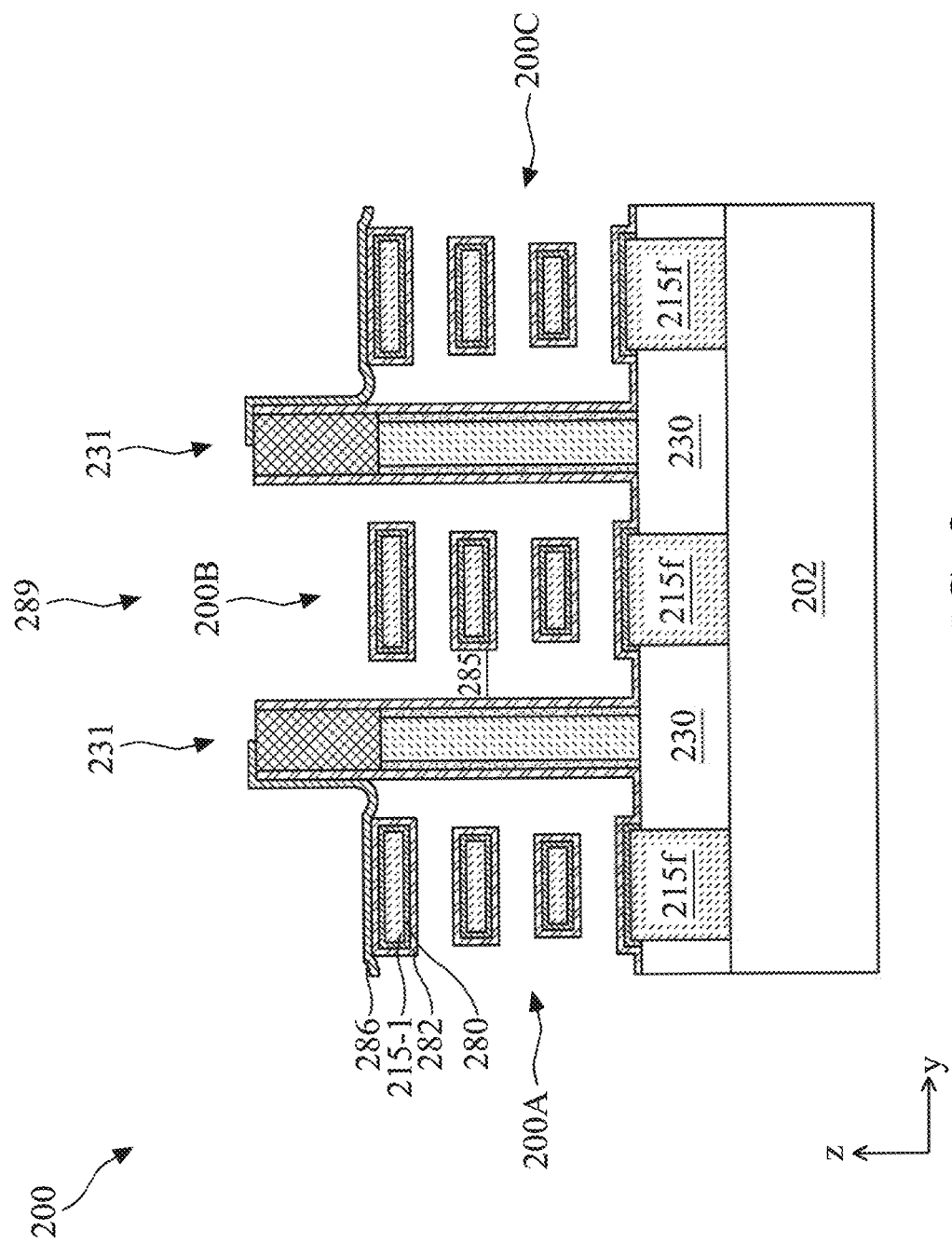

At operation 114, the method 100 (FIG. 1A) etches the dielectric layer 286 through the opening 289. The resultant structure is shown in FIG. 8 according to an embodiment. As depicted, the dielectric layer 286 is removed from the stack 200B and from the dummy fins 231 that are exposed in the opening 289, thereby exposing the air gap (or space) 277 and 285 between the dummy fins 231. The high-k dielectric layer 282 on the stack 200B of channel layers 215 are exposed. The etching process provides a high etching selectivity with respect to the dielectric layer 286 relative to the high-k dielectric layer 282. The etching process may implement wet etching, dry etching, or a combination thereof. After the dielectric layer 286 is etched, the operation 114 removes the patterned etch mask layer 288, for example, using stripping or ashing. The resultant structure is shown in FIG. 9 according to an embodiment.

Figure 10:
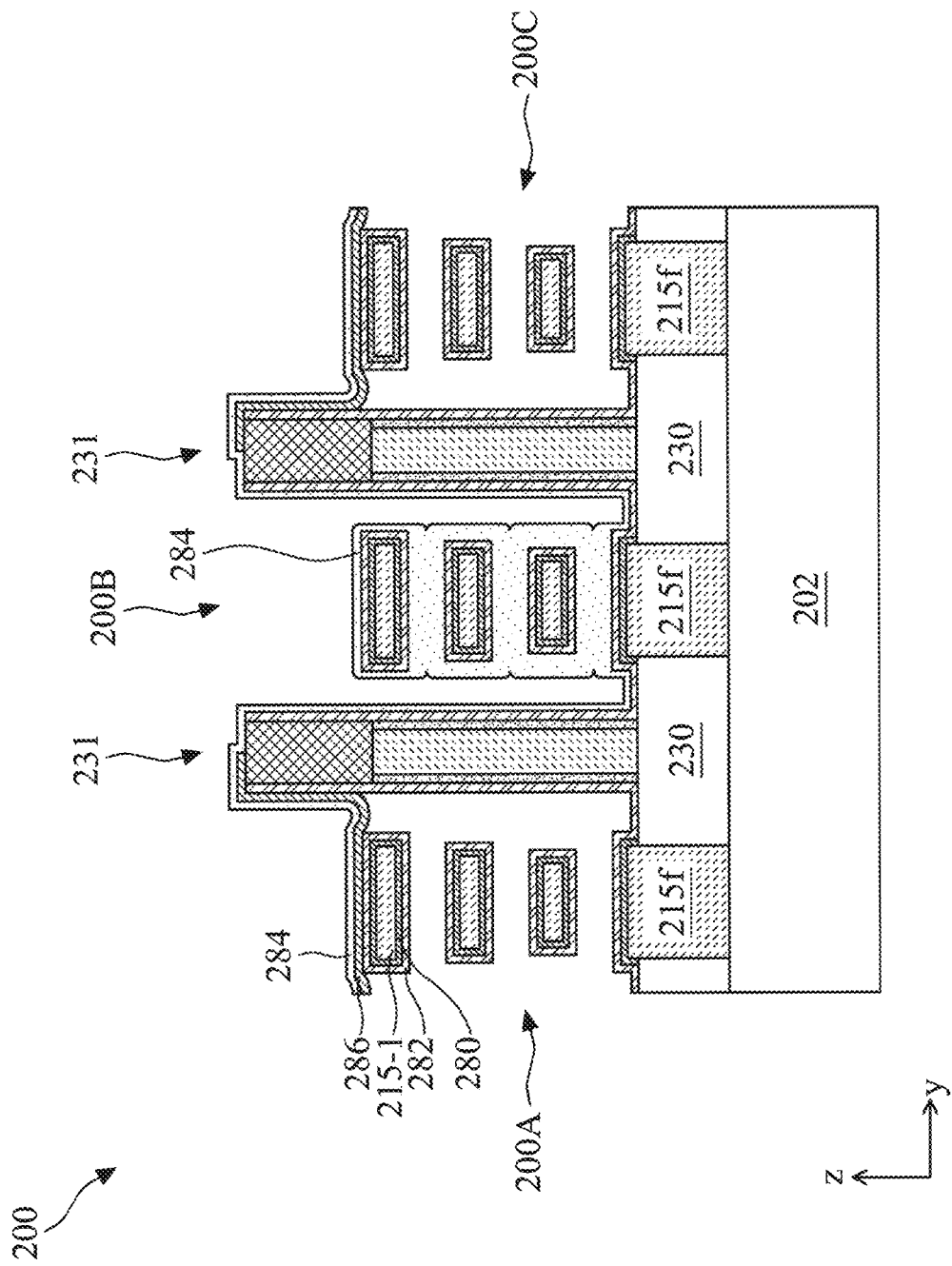

At operation 116, the method 100 (FIG. 1A) forms a work function metal layer 284, such as shown in FIG. 10 according to an embodiment. The work function metal layer 284 is deposited over the high-k dielectric layer 282 that is over the stack 200B of the channel layers 215. In an embodiment, the work function metal layer 284 completely fills the space 277 between the adjacent channel layers 215 of the stack 200B. In another embodiment, the work function metal layer 284 does not completely fill the space 277 between the adjacent channel layers 215 of the stack 200B. The work function metal layer 284 is also deposited over the dummy fins 231 and over the dielectric layer 286. In some embodiments, the work function metal layer 284 includes an n-type work function metal for n-type transistors, such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function material, or combinations thereof. In some embodiments, the work function metal layer 284 includes a p-type work function metal for p-type transistors, such as TiN, TaN, TaSN, Ru, Mo, Al, WN, WCN $ZrSi_2$, $MoSi_2$, $TaSi_2$, $NiSi_2$, other p-type work function material, or combinations thereof. In some embodiments, the work function metal layer 284 has a thickness of about 1 nm to about 4 nm. The work function metal layer 284 may be deposited using ALD, CVD, PVD, or other suitable processes.

Figure 11:
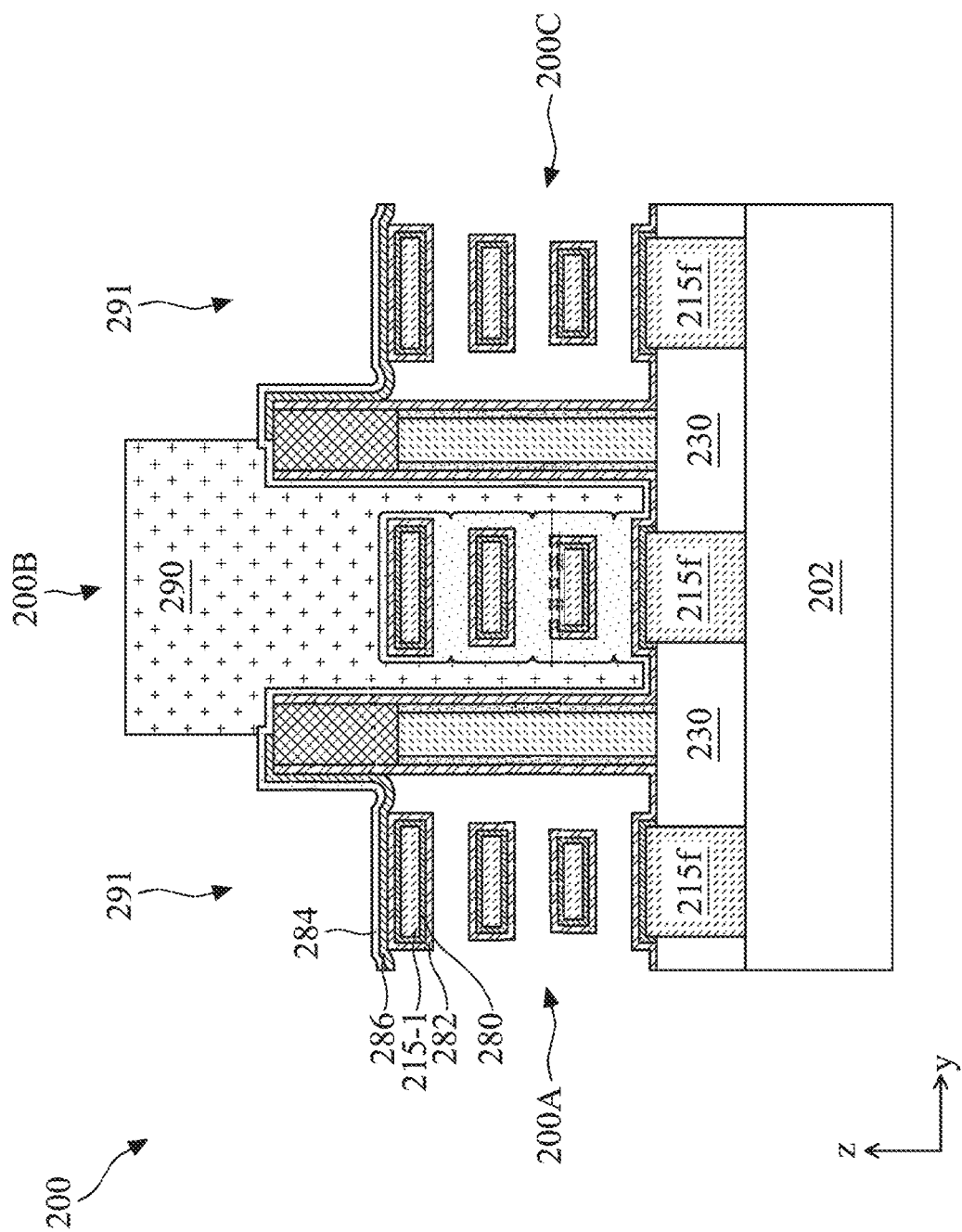

At operation 118, the method 100 (FIG. 1B) forms another etch mask layer 290 over the device 200 (particularly, over the work function metal layer 284) and patterns the etch mask layer 290 to provide openings 291. The etch mask layer 290 may be formed and patterned in a manner similar to those for the etch mask layer 288. As shown in FIG. 11, the patterned etch mask layer 290 covers the stack 200B, and the openings 291 expose the work function metal layer 284 directly above the stacks 200A and 200C.

Figure 12:
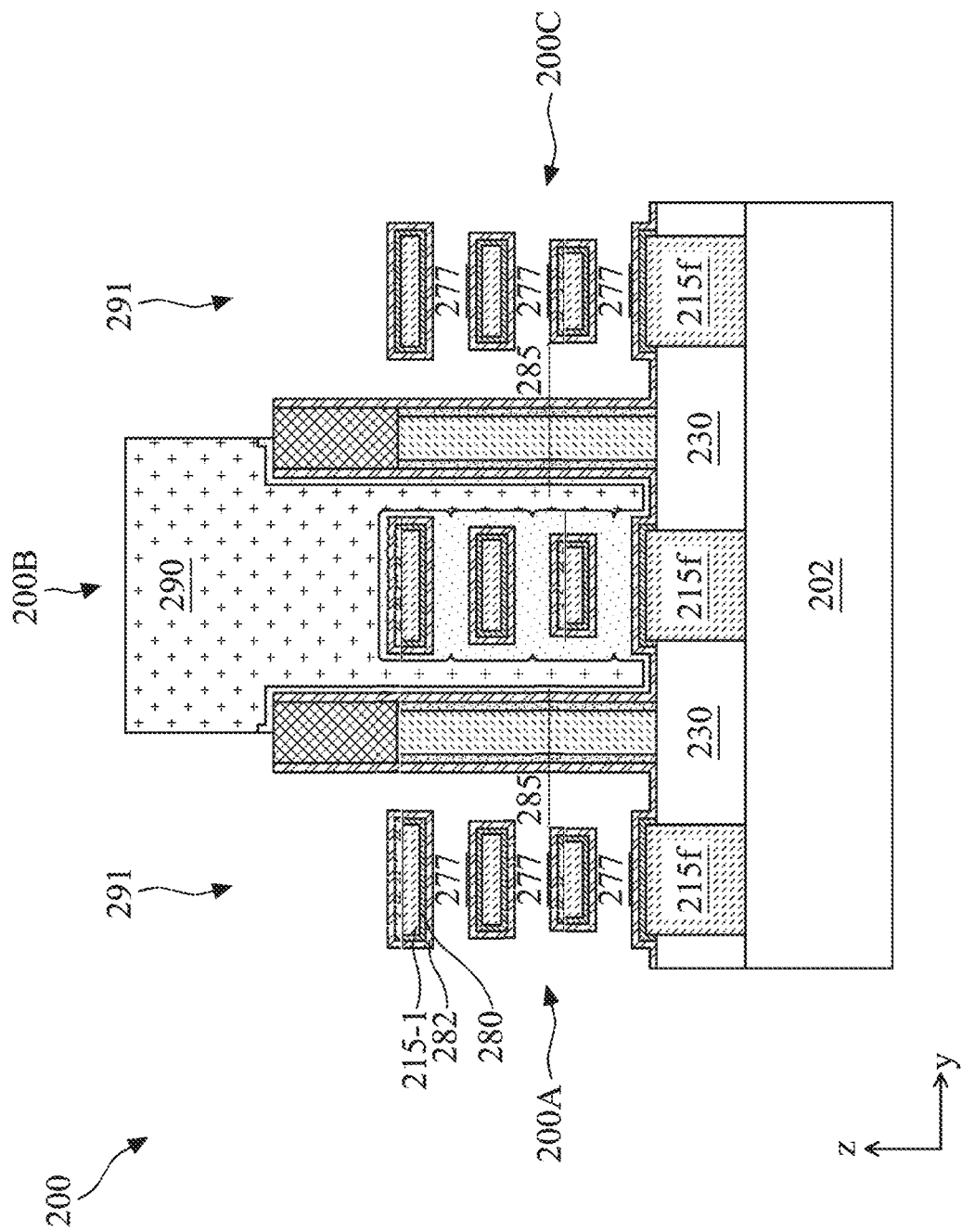
Figure 13:
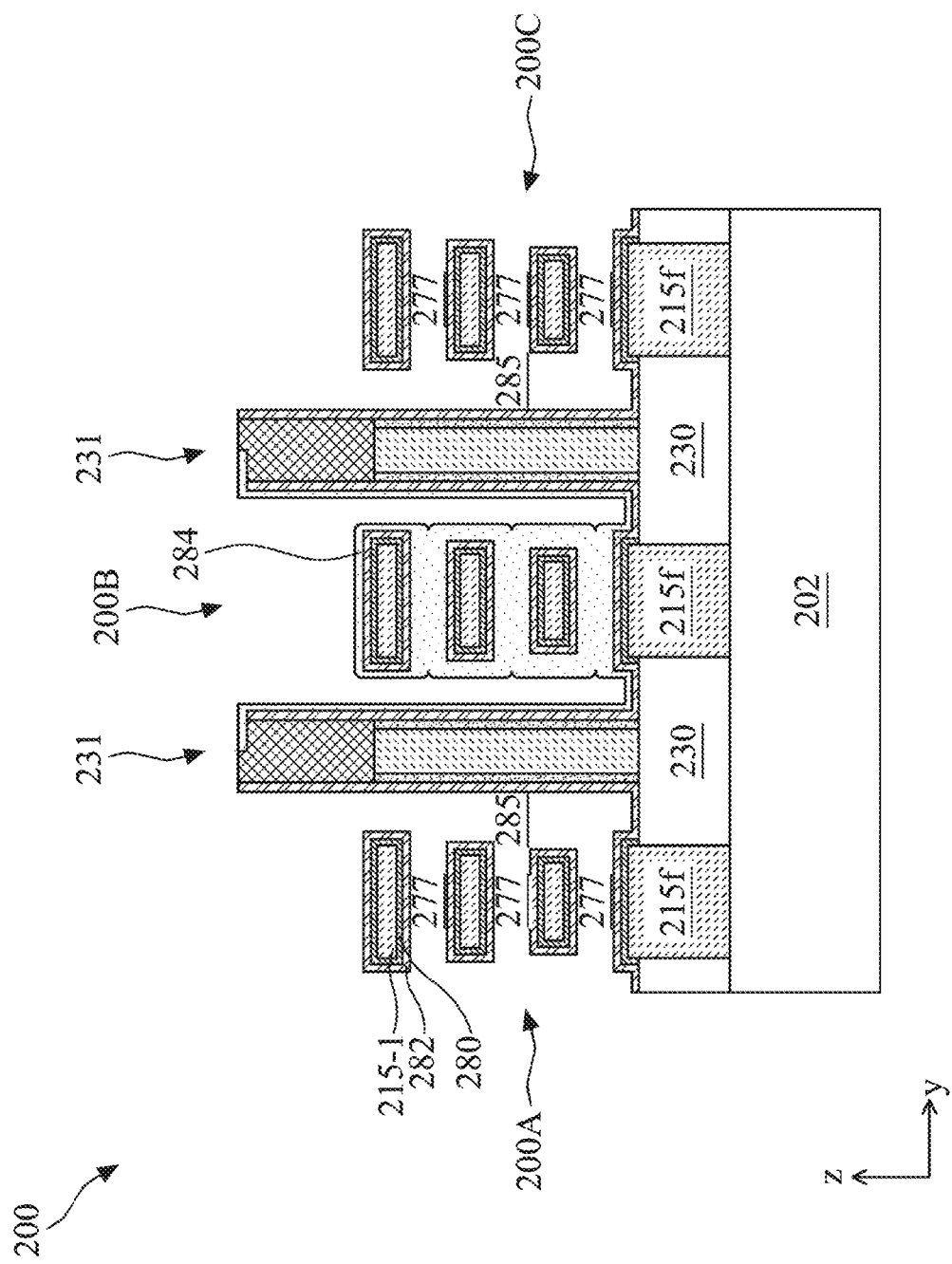

At operation 120, the method 100 (FIG. 1B) etches the work function metal layer 284 and the dielectric layer 286 through the openings 291, thereby exposing the high-k dielectric layer 282 over the stacks 200A and 200C of the channel layers 215, such as shown in FIG. 12. Effectively, operation 120 exposes the air gaps 277 and 285 surrounding the stacks 200A and 200C of the channel layers 215. The work function metal layer 284 and the dielectric layer 286 may be etched using one or more etching processes that may be wet etching, dry etching, or other etching techniques. The etching processes are designed to be selective to the materials of the work function metal layer 284 and the dielectric layer 286, with little to no etching to the high-k dielectric layer 282. After the work function metal layer 284 and the dielectric layer 286 are etched, the patterned etch mask layer 290 is removed, for example, using stripping or ashing. The resultant structure is shown in FIG. 13 according to an embodiment.

Figure 14:
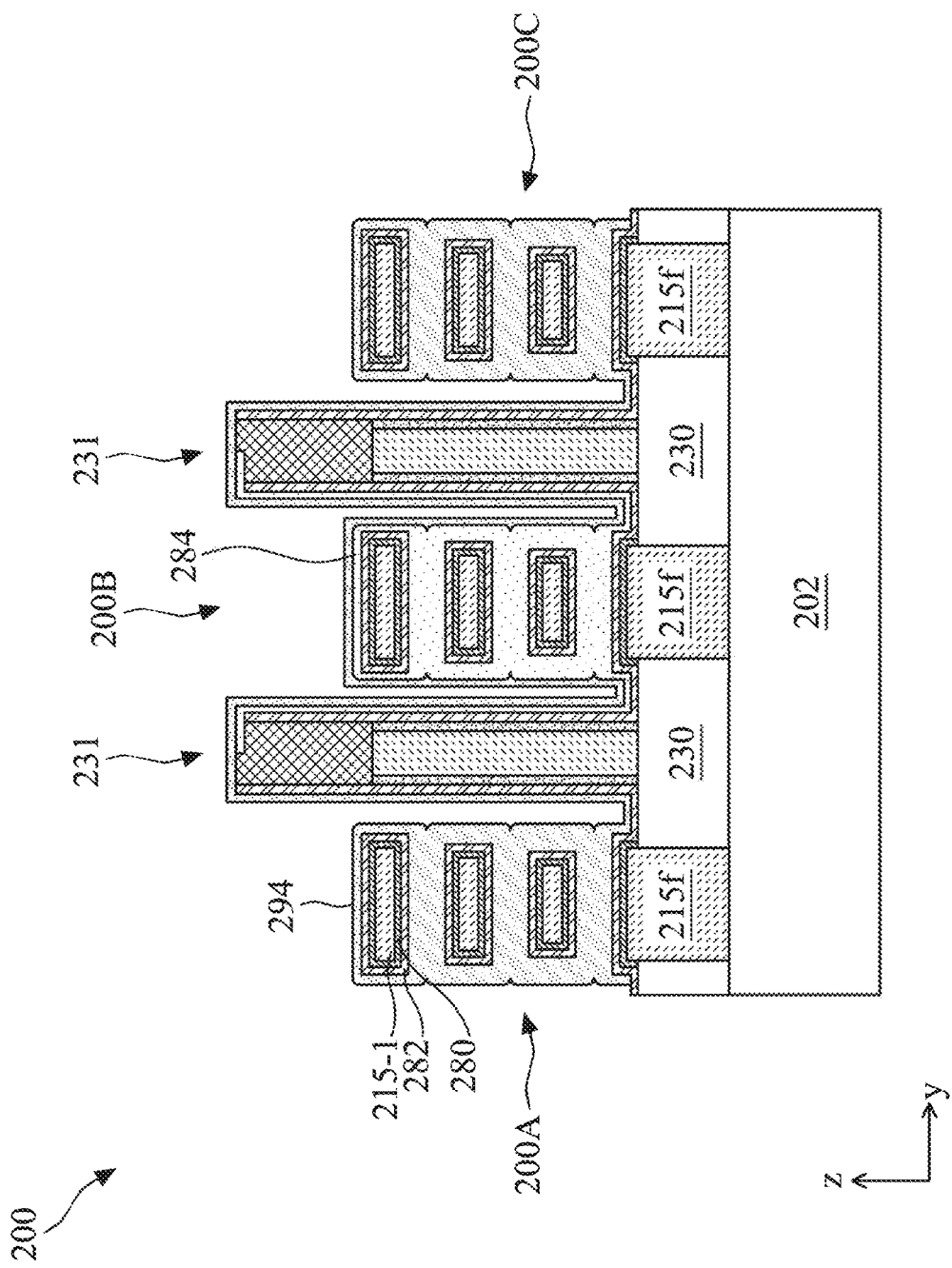

At operation 122, the method 100 (FIG. 1B) forms another work function metal layer 294, such as shown in FIG. 14 according to an embodiment. The work function metal layer 294 is deposited over the high-k dielectric layer 282 that is over the stacks 200A and 200C of the channel layers 215. In an embodiment, the work function metal layer 294 completely fills the space 277 between the adjacent channel layers of the stacks 200A and between the adjacent channel layers of the stacks 200C. In another embodiment, the work function metal layer 294 does not completely fill the space 277 between the adjacent channel layers of the stacks 200A and 200C. The work function metal layer 294 is also deposited over the dummy fins 231 and over the work function metal layer 284. In some embodiments, the work function metal layer 294 includes an n-type work function metal for n-type transistors, such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function material, or combinations thereof. In some embodiments, the work function metal layer 294 includes a p-type work function metal for p-type transistors, such as TiN, TaN, TaSN, Ru, Mo, Al, WN, WCN $ZrSi_2$, $MoSi_2$, $TaSi_2$, $NiSi_2$, other p-type work function material, or combinations thereof. In some embodiments, the work function metal layer 294 has a thickness of about 1 nm to about 4 nm. The work function metal layer 294 may be deposited using ALD, CVD, PVD, or other suitable processes. In an embodiment, the work function metal layer 284 and the work function metal layer 294 are designed to provide different work functions. For example, the work function metal layer 284 may be an n-type work function metal and the work function metal layer 294 may be a p-type work function metal, or vice versa.

Figure 15:
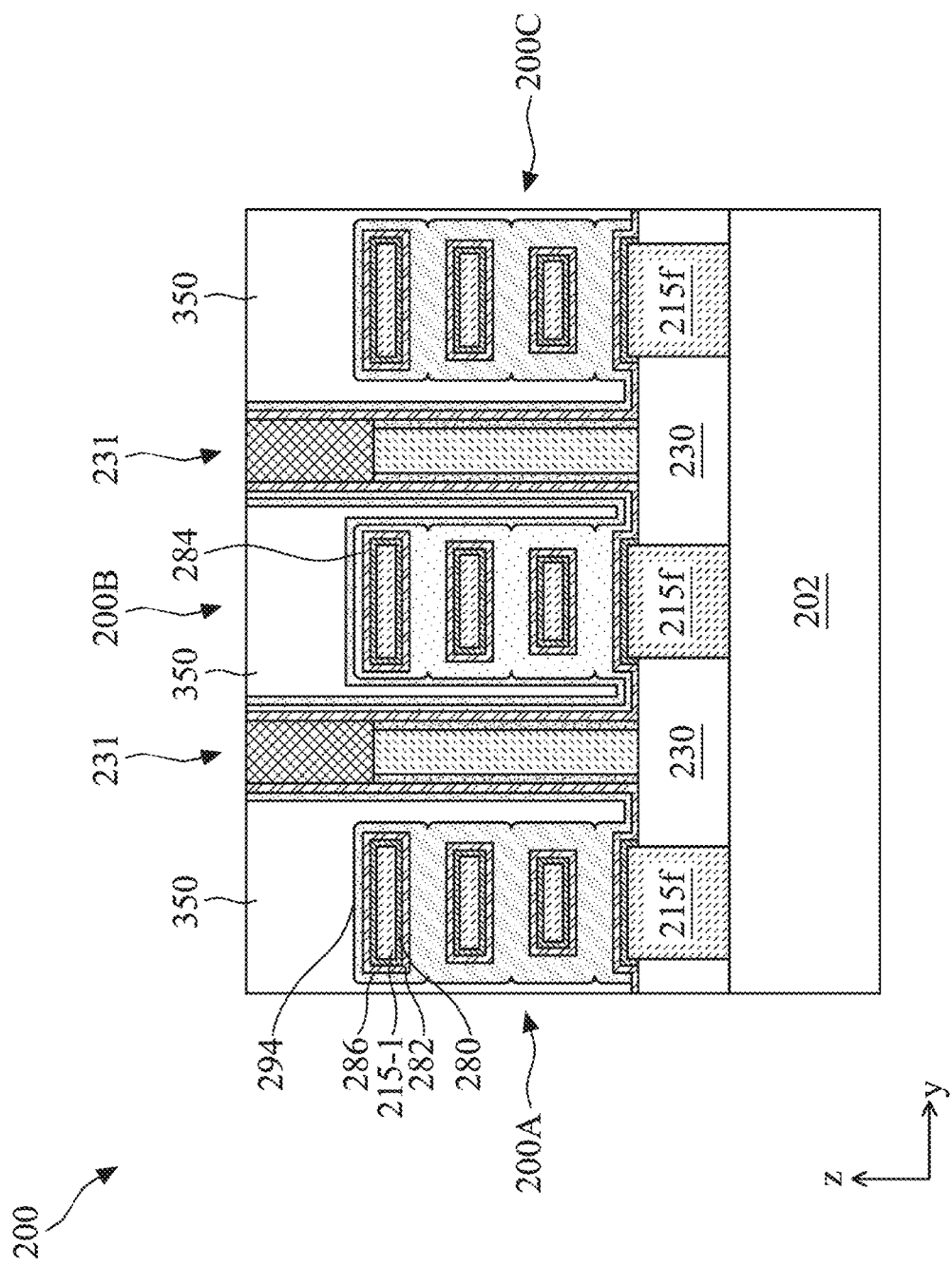

At operation 124, the method 100 (FIG. 1B) forms a gate electrode layer 350 over the work function metal layer 284 and the work function metal layer 294, such as shown in FIG. 15 according to an embodiment. The gate electrode layer 350 may be deposited using ALD, CVD, PVD, plating, or other suitable processes to fill any remaining portion of gate trenches 275. The gate electrode layer 350 includes a suitable conductive material, such as Al, W, and/or Cu. The gate electrode layer 350 may additionally or collectively include other metals, metal oxides, metal nitrides, other suitable materials, or combinations thereof. In some implementations, a blocking layer (not shown) is optionally formed (e.g., by ALD) over the work function metal layers 284 and 294 before forming the gate electrode layer 350, such that the gate electrode layer 350 is disposed on the blocking layer. After the gate electrode layer 350 is deposited, a planarization process may then be performed to remove excess gate electrode materials from the device 200. For example, a CMP process is performed until the top surfaces of the dummy fins 231 are exposed.

At operation 126, the method 100 (FIG. 1B) performs further fabrication to the device 200. For example, the method 100 may form S/D contacts that electrically connect to the S/D 260 (FIG. 2B), forming gate vias that electrically connect to the gate electrode layer 350, and forming multi-layer interconnects that connect the transistors and other components in the device 200 to form a complete IC.

Figure 16:
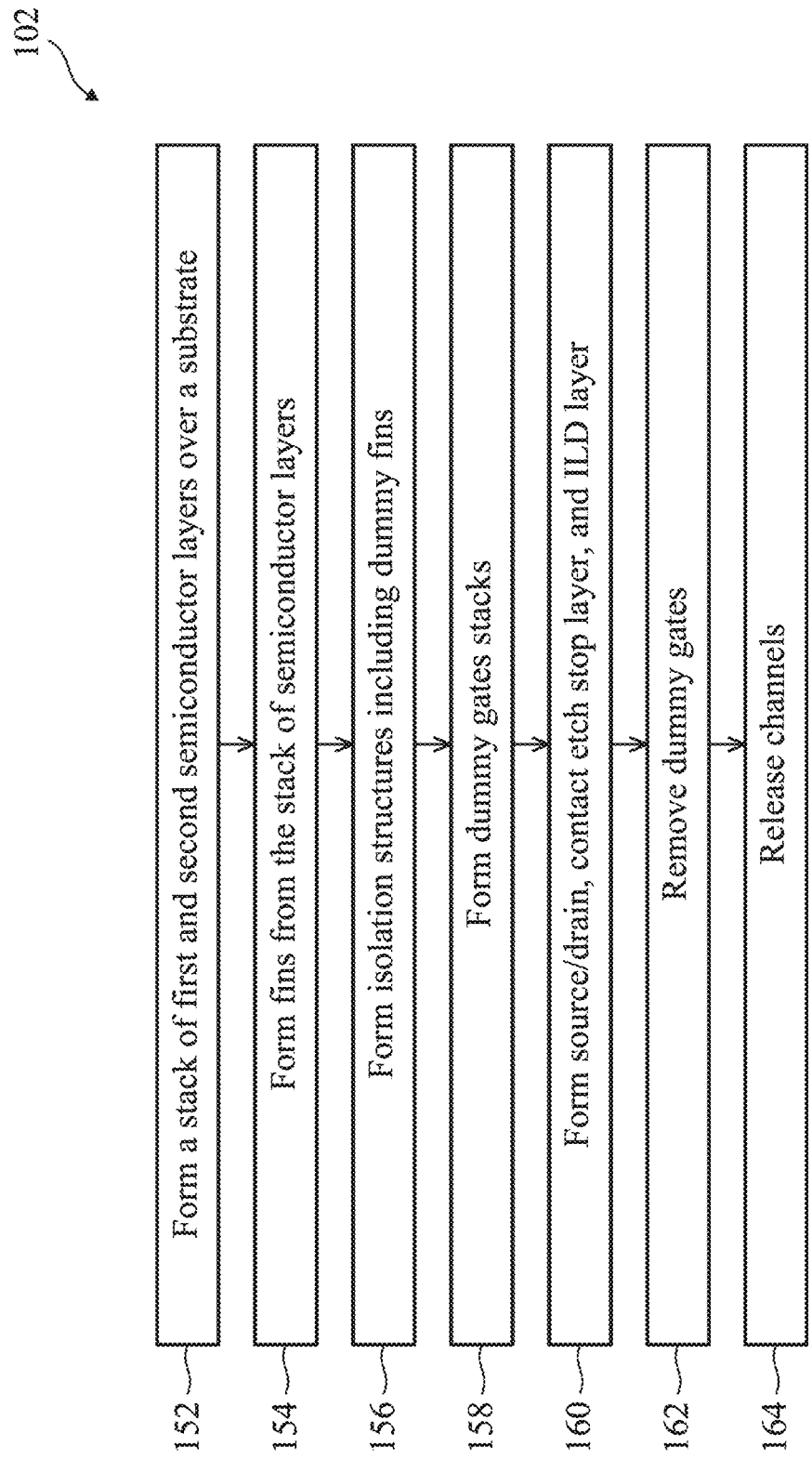
FIG. 16 is a flow chart for fabricating a semiconductor device according to various aspects of the present disclosure.

FIG. 16 shows a flow chart for an embodiment of the operation 102. As illustrated, the operation 102 includes operations (or sub-operations) 152, 154, 156, 158, 160, 162, and 164. Additional processing is contemplated by the present disclosure. Additional operations can be provided before, during, and after those shown in FIG. 16, and some of the operations of FIG. 16 can be moved, replaced, or eliminated for additional embodiments. FIG. 16 is described below in conjunction with FIG. 17A through FIG. 22C. Particularly, FIGS. 17A, 18A, 19A, 20A, 21A, and 22A illustrate diagrammatic perspective views of the device 200, FIGS. 17B, 18B, 19B, 20B, 21B, and 22B illustrate diagrammatic cross-sectional views of the device 200 in the x-z plane, and FIGS. 17C, 18C, 19C, 20C, 21C, and 22C illustrate diagrammatic cross-sectional views of the device 200 in the y-z plane.

Figure 17A:
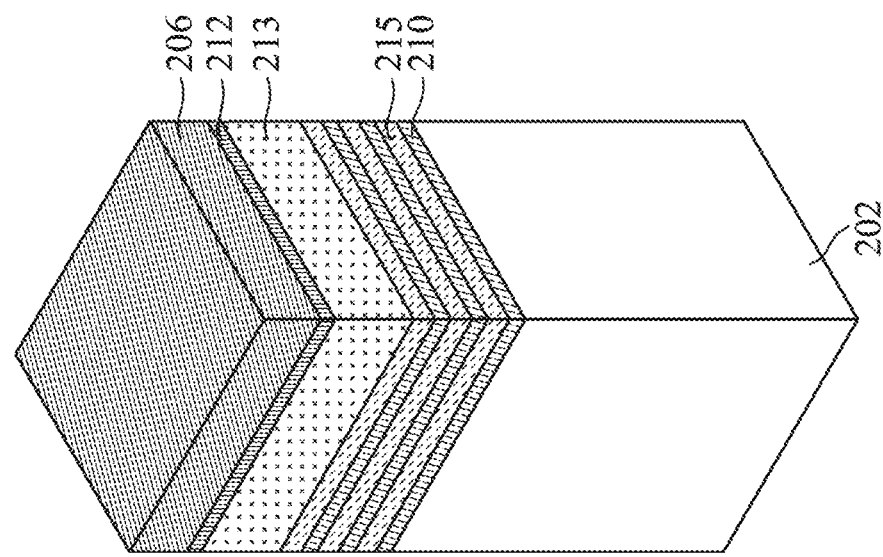
FIGS. 17A, 18A, 19A, 20A, 21A, and 22A are diagrammatic perspective views of a semiconductor device, in portion, at various fabrication stages (such as those associated with the method in FIG. 16) according to various aspects of the present disclosure.

Referring to FIGS. 17A-C, the operation 152 (FIG. 16) forms a stack of semiconductor layers 210 and semiconductor layers 215 over the substrate 202. The semiconductor layers 210 and semiconductor layers 215 are stacked vertically (e.g., along the z-direction) in an interleaving or alternating configuration from a surface of the substrate 202. In some embodiments, semiconductor layers 210 and semiconductor layers 215 are epitaxially grown in the depicted interleaving and alternating configuration. For example, a first one of semiconductor layers 210 is epitaxially grown on the substrate 202, a first one of semiconductor layers 215 is epitaxially grown on the first one of semiconductor layers 210, a second one of semiconductor layers 210 is epitaxially grown on the first one of semiconductor layers 215, and so on until semiconductor layers stack has a desired number of semiconductor layers 210 and semiconductor layers 215. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. For example, semiconductor layers 210 and semiconductor layers 215 may include different materials, different constituent atomic percentages, different constituent weight percentages, and/or other characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

In an embodiment, semiconductor layers 215 include crystalline silicon and semiconductor layers 210 include silicon germanium. Further, the Ge atom percent (atom %) among the semiconductor layers 210 are designed to be different. For example, the Ge atom % in the topmost semiconductor layer 210 is lower than other semiconductor layers 210. In a further embodiment, the Ge atom % in the semiconductor layers 210 gradually decrease as they are further away from the upper surface of the substrate 202. For example, the bottommost semiconductor layer 210 may have a Ge atom % in a range of about 25 atom % to about 30 atom %, the middle semiconductor layer 210 may have a Ge atom % in a range of about 23 atom % to about 25 atom %, and the topmost semiconductor layer 210 may have a Ge atom % in a range of about 20 atom % to about 23 atom %. The different Ge atom % among the semiconductor layers 210 can be controlled as the semiconductor layers 210 are formed (e.g., epitaxially grown). Some of the Ge atoms may diffuse from the semiconductor layers 210 to the semiconductor layers 215 during various subsequent processes. As a result, the portions of the semiconductor layers 215 that directly interface with the semiconductor layers 210 also have some silicon germanium with low Ge concentration (or low Ge atom percent). For convenience, these portions are referred to as Ge-diffused portions. It is noted that the Ge-diffused portions in the bottommost semiconductor layer 215 is slightly thicker than the Ge-diffused portions in the middle semiconductor layer 215 which is slightly thicker than the Ge-diffused portions in the topmost semiconductor layer 215. As will be discussed, the different Ge-diffused portions in the semiconductor layers 215 contribute to the different widths of the channel layers 215 (as depicted in FIG. 2C) during a subsequent etching process.

As shown in FIGS. 17A-C, the device 200 is further provided with a cladding layer 213 (such as having SiGe) over the stack of semiconductor layers 210 and 215, a pad oxide layer 212 over the cladding layer 213, and a silicon nitride layer 206 over the pad oxide layer 212.

Figure 18A:
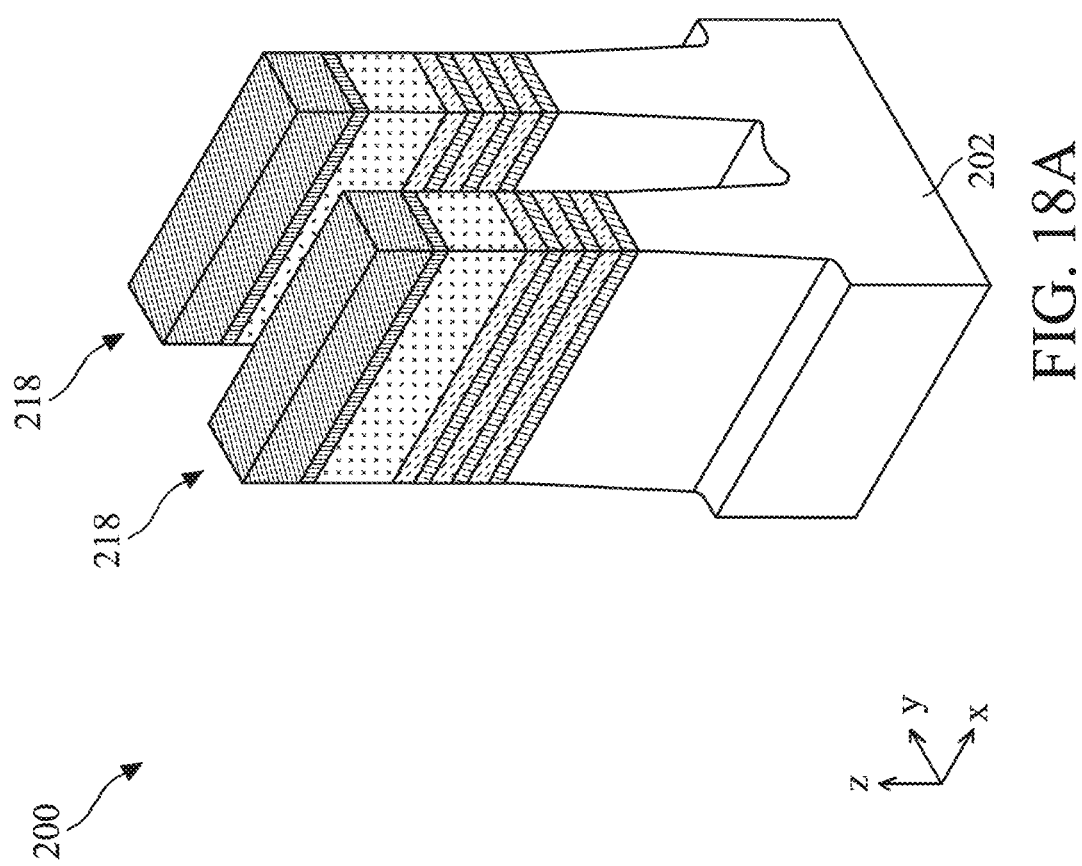
Figures 18B, 18C:
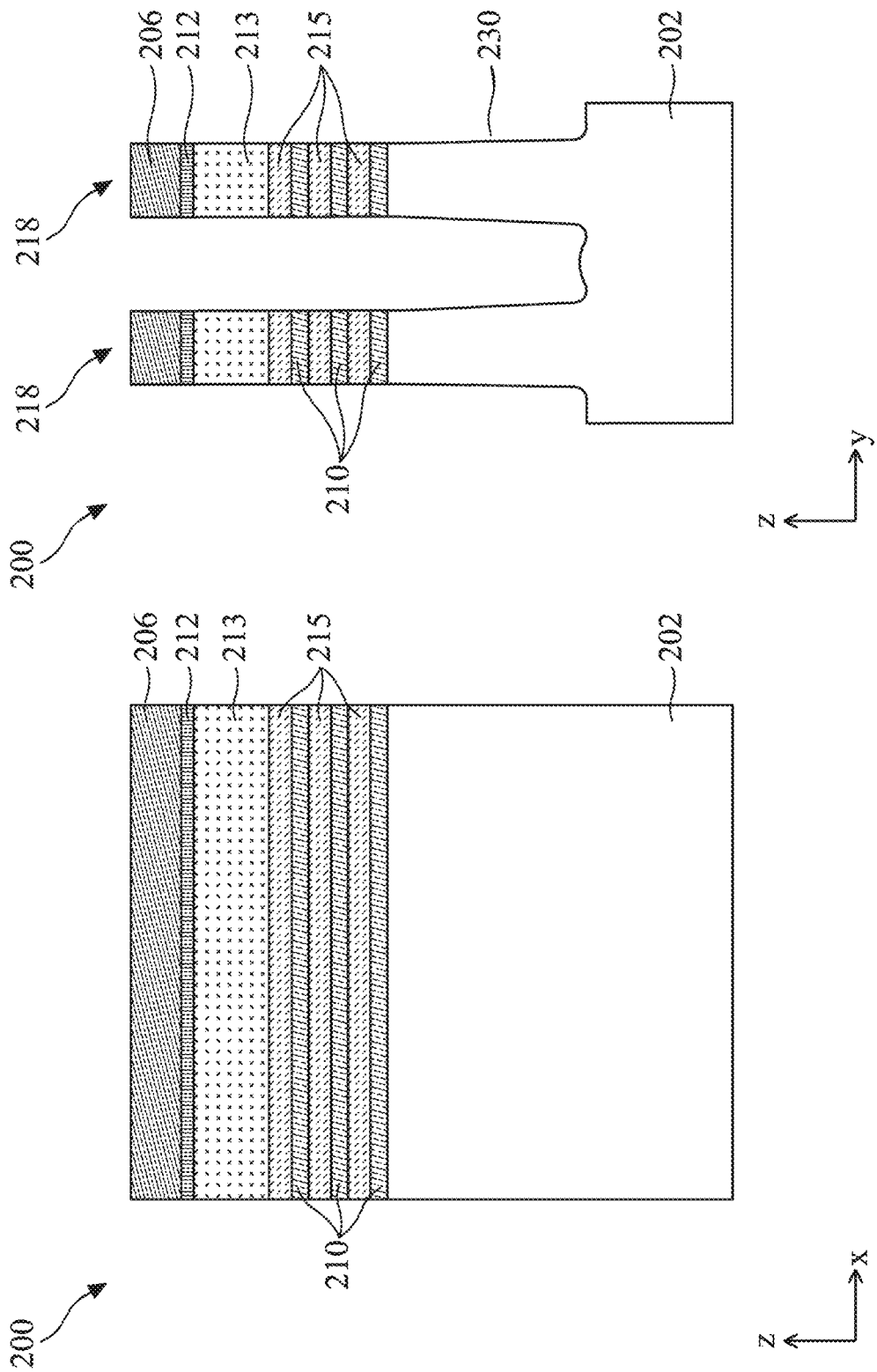

Referring to FIGS. 18A-C, the operation 154 (FIG. 16) forms fin structures 218 by patterning the stack of semiconductor layers 210 and 215 and the substrate 202. The operation 154 may use any suitable method such as one or more photolithography processes, including double-patterning or multi-patterning processes.

Figure 19A:
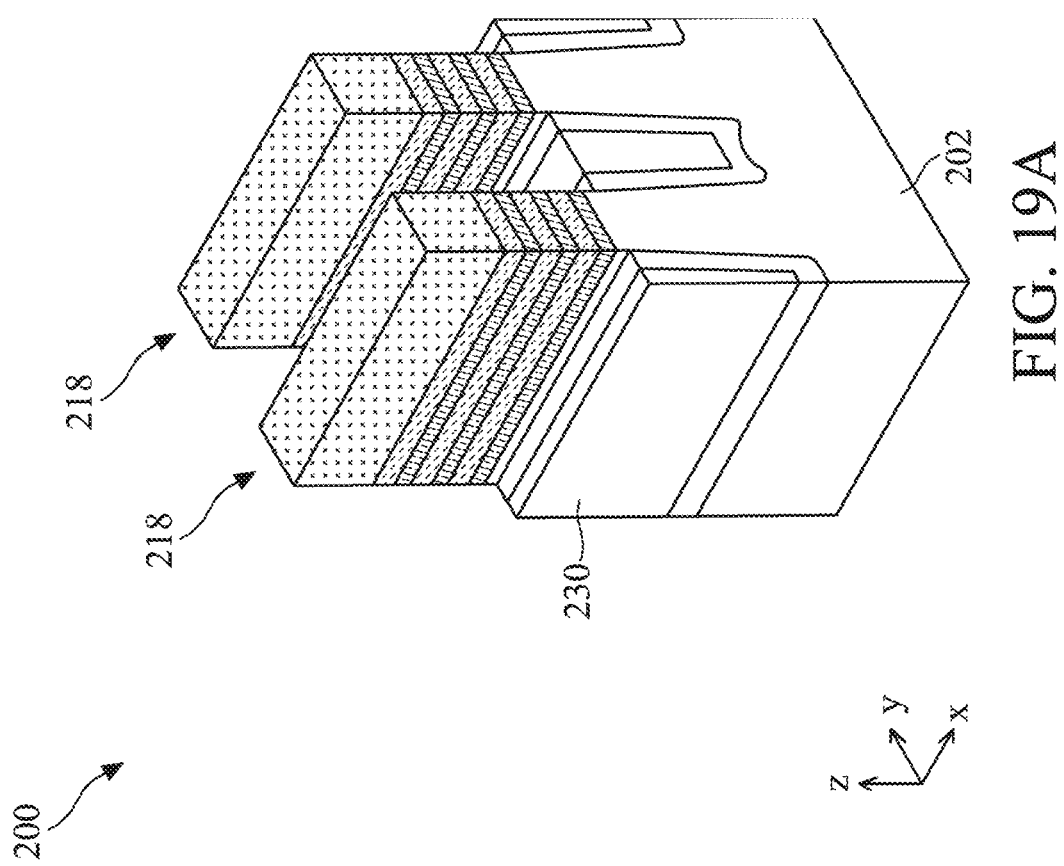

Subsequently, the operation 156 (FIG. 16) forms various isolation structures over the substrate 202 and isolate the fin structures 218. Referring to FIGS. 19A-C, isolation structure 230 is formed over and/or in substrate 202 to isolate various regions of the device 200. For example, isolation structure 230 surround a bottom portion of fin structures 218 to separate one from each other. In an embodiment, the isolation structure 230 is formed by filling the trenches between fin structures 218 with one or more insulator materials, performing a chemical mechanical polishing (CMP) process to remove excessive insulator material(s), and etching back the insulator material(s) to form isolation structure 230. In some embodiments, isolation structure 230 include a multi-layer structure, such as a silicon nitride layer disposed over a thermal oxide liner layer. The pad oxide layer 212 and the silicon nitride layer 206 are removed during the processes of forming the fin structures 218 and the isolation structure 230.

Figure 20A:
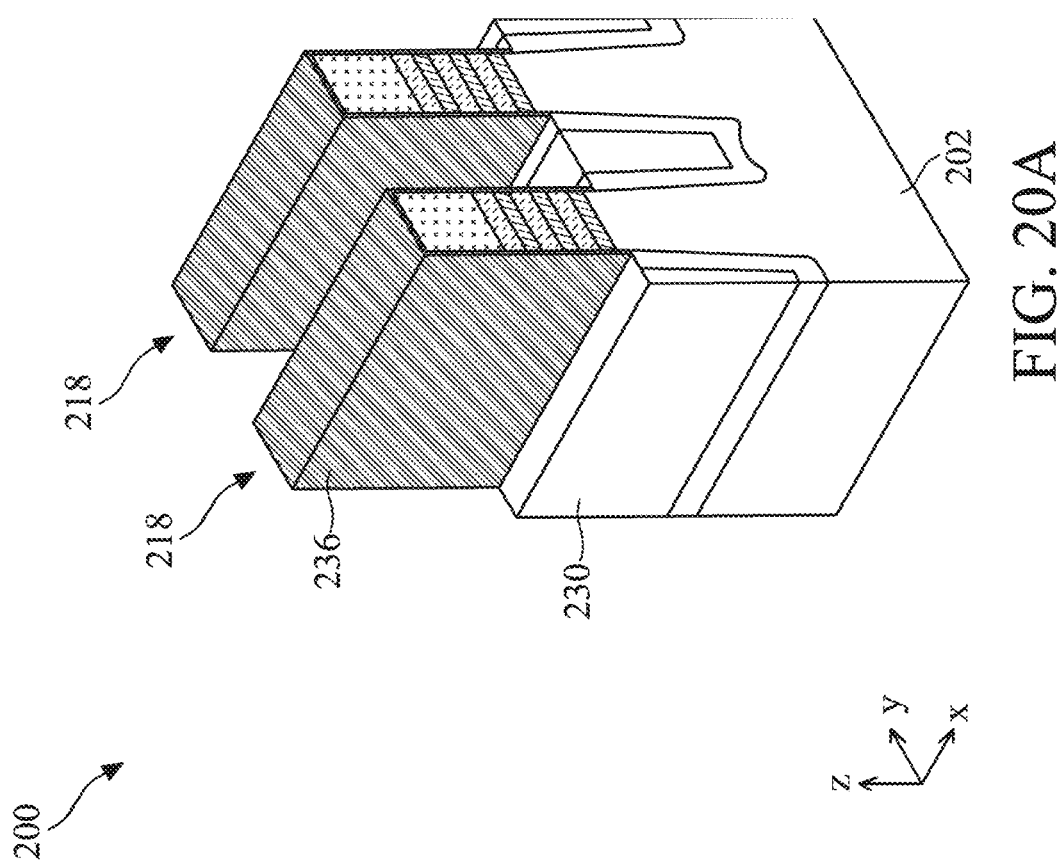
Figure 21A:
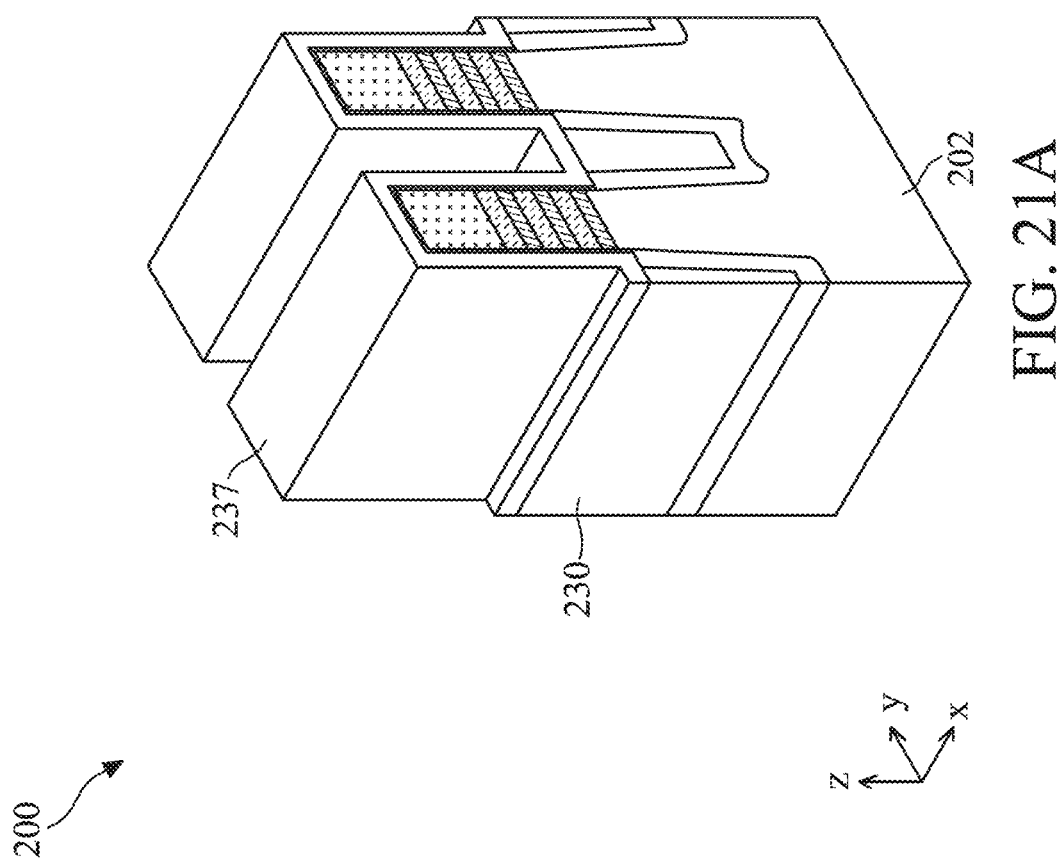
Figure 22A:
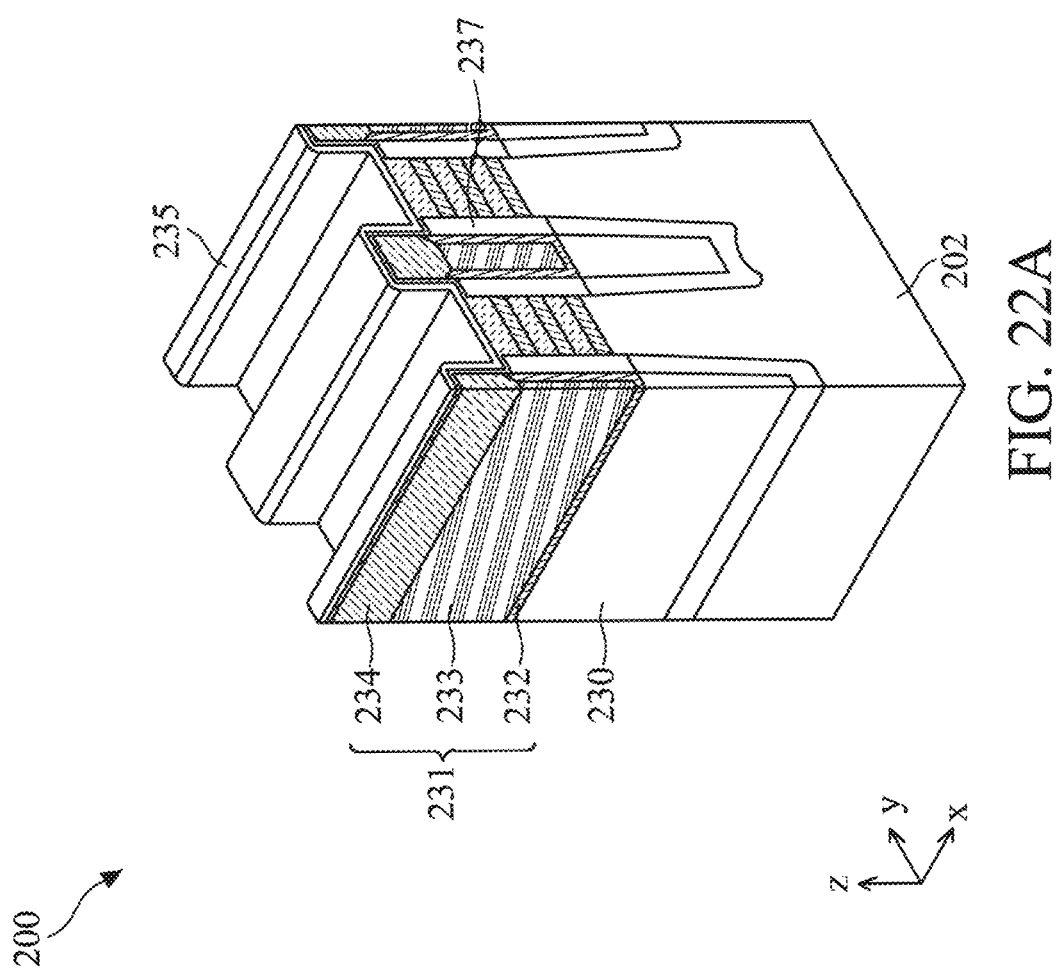
Figures 22B, 22C:
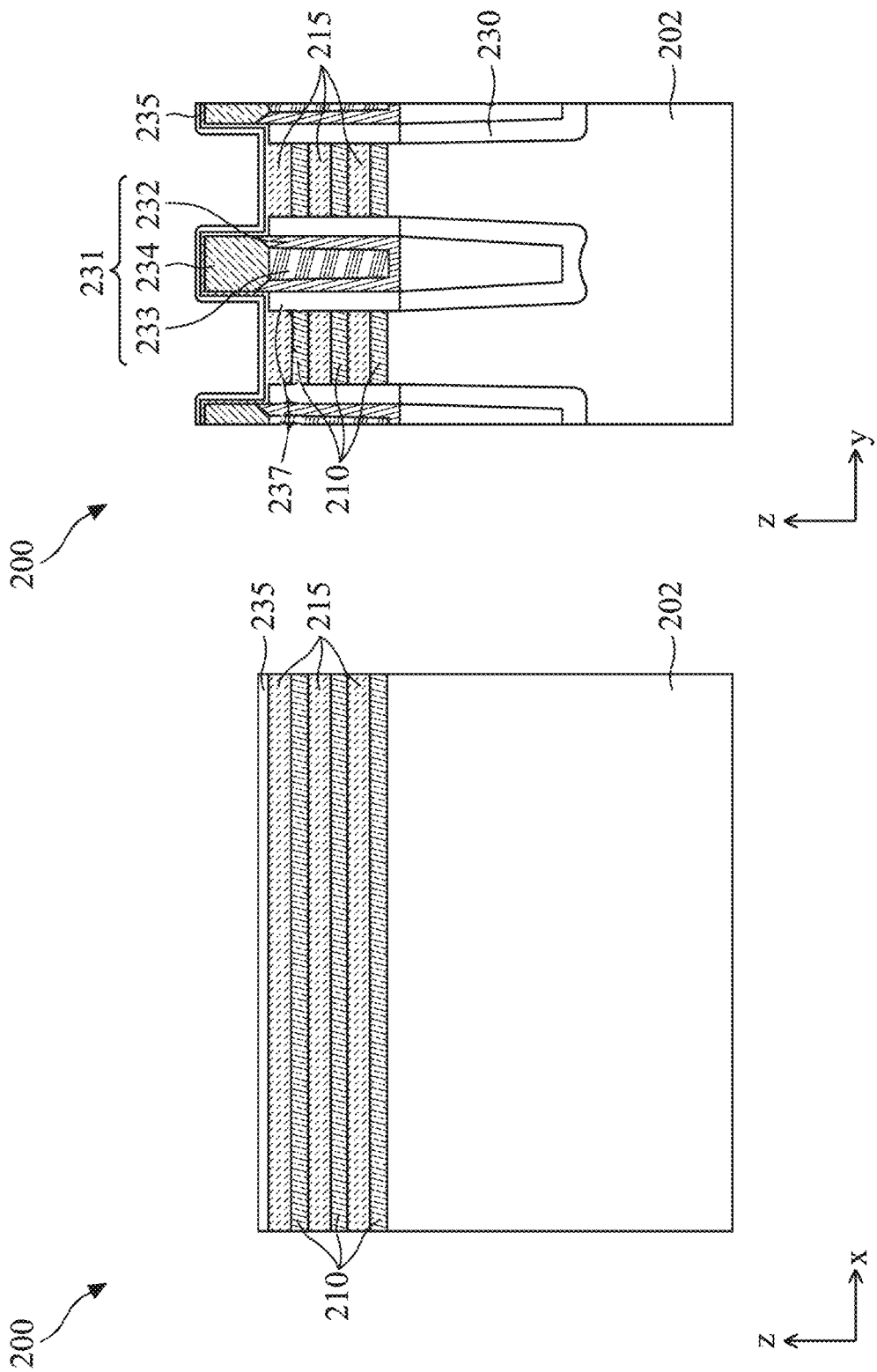

Referring to FIGS. 20A-C, a cladding oxide layer 236 is deposited over the fin structures 218 and over the isolation structure 230. Then, as shown in FIGS. 21A-C, a cladding SiGe layer 237 (such as having amorphous SiGe) is deposited over the cladding oxide layer 236. As shown in FIGS. 22A-C, dummy fins 231 are formed over the isolation structure 230 and between the cladding SiGe layer 237 on opposing fin structures 218. Furthermore, a dummy gate dielectric layer 235 is deposited over the stack of semiconductor layers 210 and 215 and the dummy fins 231.

Subsequently, operation 158 (FIG. 16) forms dummy gate stacks (not illustrated) over the dummy gate dielectric layer 235. For example, the dummy gate stacks are disposed in the gate region 206A-C of FIG. 2A. Then, operation 160 (FIG. 16) forms inner spacers 255, source/drains 260, CESL 268, and ILD layer 270 (FIG. 2B). Subsequently, operation 162 (FIG. 16) remove the dummy gate stacks from the gate region 206A-C to form gate trenches. Then, operation 164 (FIG. 16) performs a channel release process by removing the semiconductor layers 210 and the cladding SiGe layer 237 from the gate trenches 275. During the channel release process, the semiconductor layers 210 are removed from the gate trenches 275 (FIG. 2B) by an etching process that selectively etches semiconductor layers 210 with minimal (to no) etching of semiconductor layers 215. The Ge-diffused portions of the semiconductor layers 215 are partially or completely removed by the etching process as well. Because there is less Ge-diffused portion in the topmost semiconductor layer 215 than in other semiconductor layers 215, the topmost semiconductor layer 215 is etched less than other semiconductor layers 215. As a result, the remaining portion of the topmost semiconductor layer 215 is wider than the remaining portion of other semiconductor layers 215. In some embodiment, the remaining portion of the topmost semiconductor layer 215 is also thicker than the remaining portion of other semiconductor layers 215. Similarly, the remaining portion of the middle semiconductor layer 215 is wider than the remaining portion of the bottommost semiconductor layer 215. In some embodiment, the remaining portion of the middle semiconductor layer 215 is also thicker than the remaining portion of the bottommost semiconductor layer 215. The remaining portions of the semiconductor layers 215 become the channel layers 215 shown in FIGS. 2B-2C.

Figure 23:
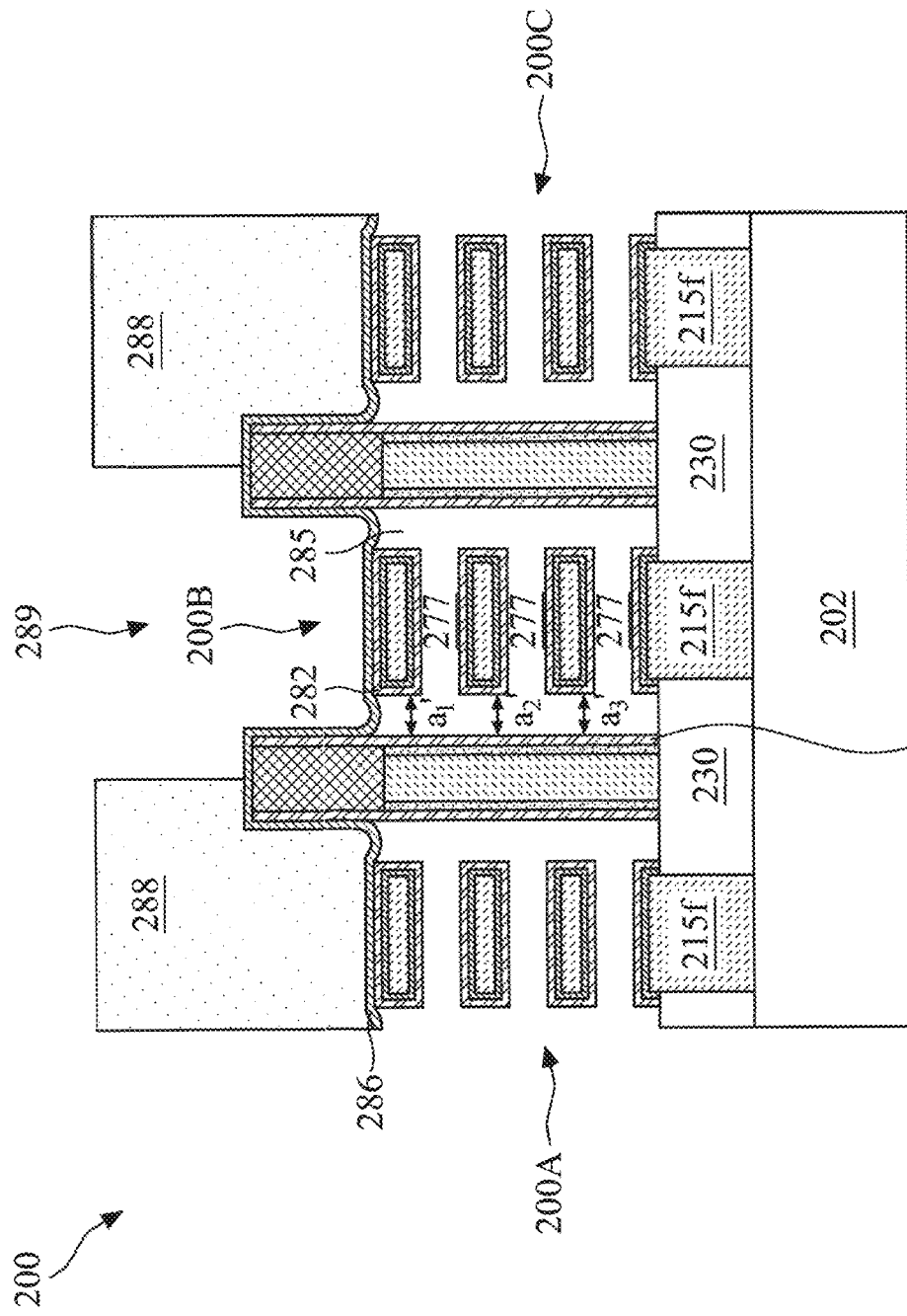
FIGS. 23 and 24 are diagrammatic cross-sectional views of a semiconductor device, in portion, according to alternative embodiments of the present disclosure.

FIG. 23 illustrates the device 200 at a fabrication stage according to an alternative embodiment. Comparing this embodiment with the embodiment shown in FIG. 7, the channel layers 215 in each stack 200A-C in this embodiment have above the same width. As a result, the distance $a_1'$, $a_2'$, and $a_3'$ are about the same, and each of them is smaller than the merge-CD of the dielectric layer 286. Similar to the embodiment shown in FIG. 7, the dielectric layer 286 is deposited above the space 285 and 277.

Figure 24:
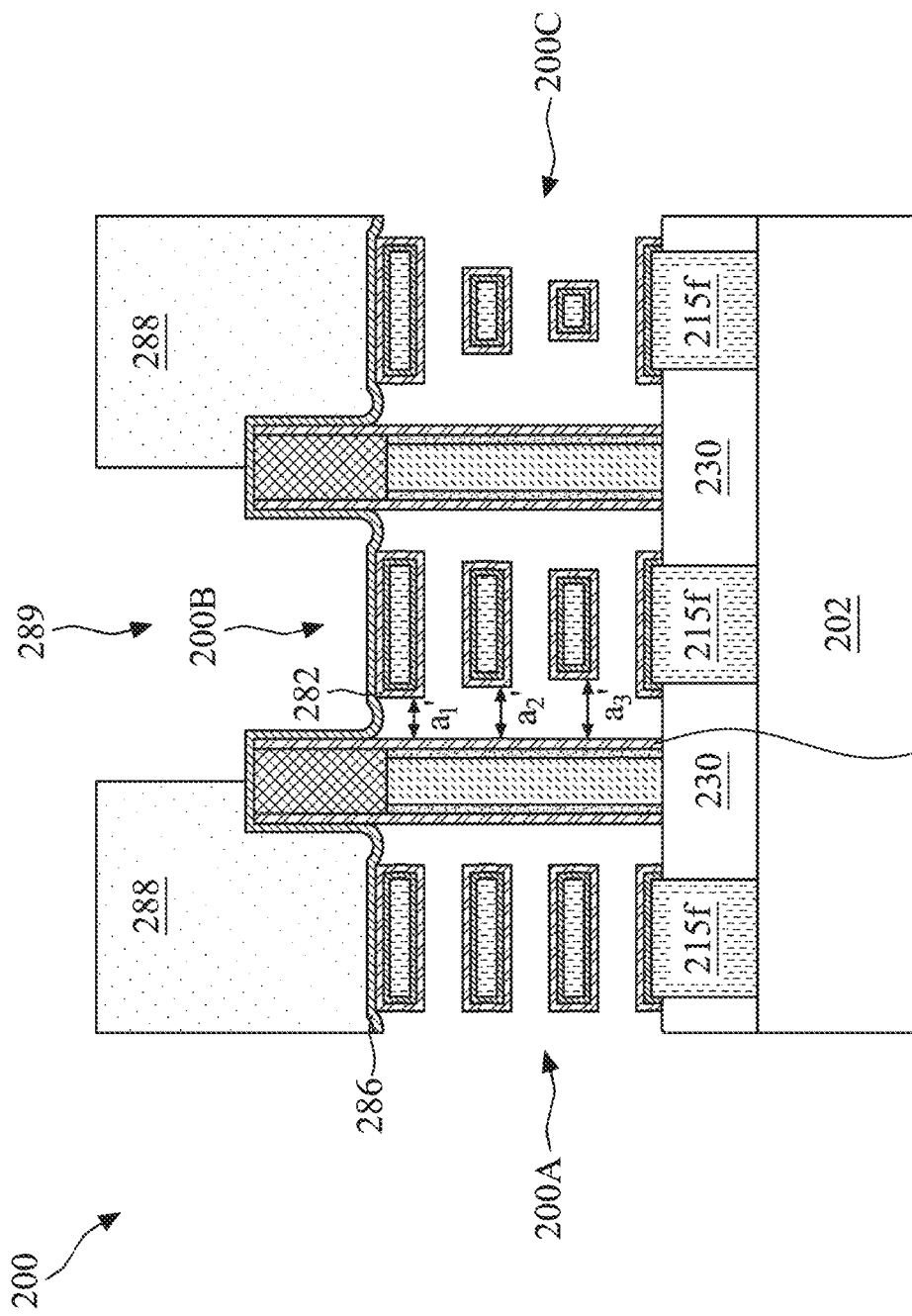

FIG. 24 illustrates the device 200 at a fabrication stage according to yet another embodiment. Comparing this embodiment with the embodiment shown in FIG. 7, different stacks 200A-C of the channel layers 215 in this embodiment have different width variations. For example, the stack 200A of the channel layers 215 have about the same width (i.e., little to no width variation in stack 200A), while the stacks 200B and 200C of the channel layers 215 have increasing widths as the channel layers 215 are further away from the upper surface of the substrate 202. Further, the increase in the widths in the stack 200B between two adjacent channel layers is smaller than the increase in the widths in the stack 200C between two adjacent channel layers. However, for each stack 200A-C, the distance $a_1'$ is smaller than the merge-CD of the dielectric layer 286. Similar to the embodiment shown in FIG. 7, the dielectric layer 286 is deposited above the space 285 and 277.

Although not intended to be limiting, one or more embodiments of the present disclosure provide many benefits to a semiconductor device and the formation thereof. For example, using embodiments of the present disclosure, HKMG patterning process becomes easier to control and much simpler. For example, by leaving a space narrower than the merge-CD of a dielectric layer, the dielectric layer is not deposited in space vertically between channel layers during HKMG patterning process, making it easier to remove the dielectric layer. The present embodiments can be readily integrated into existing CMOS fabrication processes.

In one example aspect, the present disclosure is directed to a method that includes providing a structure having a substrate, a dummy fin over a surface of the substrate, and a stack of semiconductor channel layers spaced vertically one from another over the surface of the substrate and adjacent to the dummy fin, wherein the dummy fin and the stack of semiconductor channel layers are oriented lengthwise generally parallel to a first direction from a top view. The method further includes forming an interfacial layer wrapping around each of the stack of semiconductor channel layers and depositing a high-k dielectric layer, wherein a first portion of the high-k dielectric layer is deposited over the interfacial layer and wrapping around each of the stack of semiconductor channel layers, and a second portion of the high-k dielectric layer is deposited on sidewalls of the dummy fin, wherein the first and the second portions of the high-k dielectric layer are spaced away from each other by a first distance along a horizontal direction in a cross-section perpendicular to the first direction. The method further includes depositing a first dielectric layer over the dummy fin and over the stack of semiconductor channel layers, wherein a merge-critical-dimension of the first dielectric layer is greater than the first distance so as to cause the first dielectric layer to be deposited in a space laterally between the dummy fin and a topmost layer of the stack of semiconductor channel layers, thereby providing air gaps vertically between adjacent layers of the stack of semiconductor channel layers and horizontally between the dummy fin and the stack of semiconductor channel layers.

In an embodiment of the method, the topmost layer of the stack of semiconductor channel layers is wider than other layers of the stack of semiconductor channel layers along the horizontal direction. In another embodiment, layers of the stack of semiconductor channel layers become wider along the horizontal direction as they are further away from the surface of the substrate.

In an embodiment, the method further includes forming an etch mask layer over the first dielectric layer; patterning the etch mask layer to provide an opening that exposes the first dielectric layer and is directly over the stack of semiconductor channel layers; and etching the first dielectric layer through the opening, thereby exposing the first portion of the high-k dielectric layer and the air gaps. In a further embodiment, the method includes forming a work function metal layer over the first portion of the high-k dielectric layer and wrapping around each of the stack of semiconductor channel layers; and forming a metal fill layer over the work function metal layer.

In an embodiment of the method, the providing of the structure includes forming first semiconductor layers and second semiconductor layers alternately stacked one layer over another, wherein the first and the second semiconductor layers include different materials, wherein an etch rate of the first semiconductor layers in an etchant decreases as the first semiconductor layers are further away from the surface of the substrate, wherein the stack of semiconductor channel layers are portions of the first semiconductor layers. In a further embodiment, the first semiconductor layers include crystalline silicon, the second semiconductor layers include silicon germanium, and a germanium atomic percent in the silicon germanium decreases as the second semiconductor layers are further away from the surface of the substrate. In another further embodiment, the providing of the structure includes patterning the first and the second semiconductor layers into semiconductor fins including a first semiconductor fin; and removing the second semiconductor layers in the first semiconductor fin by one or more etching processes, wherein the first semiconductor layers in the first semiconductor fin are partially etched by the one or more etching processes, thereby forming the stack of semiconductor channel layers, wherein the stack of semiconductor channel layers become wider along the horizontal direction as they are further away from the surface of the substrate.

In another example aspect, the present disclosure is directed to a method. The method includes providing a structure having a substrate, a dummy fin over a surface of the substrate, and a stack of semiconductor channel layers spaced vertically one from another over the surface of the substrate and adjacent to the dummy fin, wherein a topmost layer of the stack of semiconductor channel layers is wider than other layers of the stack of semiconductor channel layers. The method further includes forming an interfacial layer wrapping around each of the stack of semiconductor channel layers and depositing a high-k dielectric layer, wherein a first portion of the high-k dielectric layer is deposited over the interfacial layer and wrapping around each of the stack of semiconductor channel layers, and a second portion of the high-k dielectric layer is deposited on sidewalls of the dummy fin, wherein the first portion of the high-k dielectric layer wrapping around the topmost layer of the stack of semiconductor channel layers is spaced away from the second portion of the high-k dielectric layer by a first lateral distance, and the first portion of the high-k dielectric layer wrapping around the other layers of the stack of semiconductor channel layers is spaced away from the second portion of the high-k dielectric layer by a second lateral distance less than the first lateral distance. The method further includes depositing a metal oxide layer over the dummy fin and over the stack of semiconductor channel layers, wherein a first portion of the metal oxide layer over the topmost layer of the stack of semiconductor channel layers is merged with a second portion of the metal oxide layer over the sidewalls of the dummy fin in a space laterally between the dummy fin and the topmost layer of the stack of semiconductor channel layers, thereby providing air gaps vertically between adjacent layers of the stack of semiconductor channel layers and horizontally between the dummy fin and the stack of semiconductor channel layers. The method further includes forming an etch mask layer over the metal oxide layer; patterning the etch mask layer to provide an opening that exposes the metal oxide layer and is directly over the stack of semiconductor channel layers; and etching the metal oxide layer through the opening, thereby exposing the first portion of the high-k dielectric layer and the air gaps.

In an embodiment of the method, the providing of the structure includes forming first semiconductor layers and second semiconductor layers alternately stacked one layer over another over the surface of the substrate, wherein the first and the second semiconductor layers include different materials, wherein an etch rate of a topmost layer of the first semiconductor layers in an etchant is smaller than other layers of the first semiconductor layers in the etchant; patterning the first and the second semiconductor layers into semiconductor fins including a first semiconductor fin; forming a dummy fin over the surface of the substrate and adjacent to the first semiconductor fin; and removing the second semiconductor layers in the first semiconductor fin by one or more etching processes, wherein the first semiconductor layers in the first semiconductor fin are partially etched by the one or more etching processes, thereby forming the stack of semiconductor channel layers.

In an embodiment of the method, the stack of semiconductor channel layers become wider as they are further away from the surface of the substrate. In another embodiment, each of the first and the second lateral distances is in a range from about 10 nm to about 16 nm. In another embodiment, each of the stack of semiconductor channel layers has a width in a range from about 10 nm to about 50 nm. In yet another embodiment of the method, the metal oxide layer is deposited using a chemical vapor deposition technique.

In an embodiment, the method further includes forming a work function metal layer over the first portion of the high-k dielectric layer and wrapping around each of the stack of semiconductor channel layers and forming a metal fill layer over the work function metal layer.

In yet another example aspect, the present disclosure is directed to a semiconductor structure that includes a substrate; a dummy fin over a surface of the substrate; and a stack of semiconductor channel layers spaced vertically one from another over the surface of the substrate and adjacent to the dummy fin, wherein a topmost layer of the stack of semiconductor channel layers is wider than other layers of the stack of semiconductor channel layers. The semiconductor structure further includes an interfacial layer wrapping around each of the stack of semiconductor channel layers; a high-k dielectric layer, wherein a first portion of the high-k dielectric layer is deposited over the interfacial layer and wrapping around each of the stack of semiconductor channel layers, and a second portion of the high-k dielectric layer is deposited on sidewalls of the dummy fin; a work function metal layer over the first portion of the high-k dielectric layer and wrapping around each of the stack of semiconductor channel layers; and a gate electrode layer over the work function metal layer.

In an embodiment of the semiconductor structure, the stack of semiconductor channel layers includes three or more semiconductor channel layers, wherein the stack of semiconductor channel layers become wider as they are further away from the surface of the substrate. In a further embodiment, each of the stack of semiconductor channel layers has a width in a range from about 10 nm to about 50 nm.

In another embodiment of the semiconductor structure, the first portion of the high-k dielectric layer wrapping around the topmost layer of the stack of semiconductor channel layers is spaced away from the second portion of the high-k dielectric layer by a first lateral distance, and the first portion of the high-k dielectric layer wrapping around the other layers of the stack of semiconductor channel layers is spaced away from the second portion of the high-k dielectric layer by a second lateral distance less than the first lateral distance. In a further embodiment, each of the first and the second lateral distances is in a range from about 10 nm to about 16 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    a dummy fin over a surface of the substrate;
    two stacks of semiconductor channel layers on two sides of the dummy fin and spaced from the dummy fin, wherein a topmost layer of each stack of semiconductor channel layers is wider than other layers of the respective stack of semiconductor channel layers;
    an interfacial layer wrapping around each of the semiconductor channel layers in the two stacks;
    a high-k dielectric layer wrapping around each of the semiconductor channel layers in the two stacks; and
    a gate electrode layer over the high-k dielectric layer.

2. The semiconductor structure of claim 1, wherein each of the two stacks of semiconductor channel layers includes three or more semiconductor channel layers, wherein the three or more semiconductor channel layers become wider as they are further away from the surface of the substrate.

3. The semiconductor structure of claim 2, wherein each of the three or more semiconductor channel layers in each of the two stacks has a width in a range from about 10 nm to about 50 nm.

4. The semiconductor structure of claim 1, wherein a first portion of the high-k dielectric layer wrapping around the topmost layer of each stack of semiconductor channel layers is spaced away from a second portion of the high-k dielectric layer disposed on sidewalls of the dummy fin by a first lateral distance, and wherein the first portion of the high-k dielectric layer wrapping around the other layers of each stack of semiconductor channel layers is spaced away from the second portion of the high-k dielectric layer by a second lateral distance greater than the first lateral distance.

5. The semiconductor structure of claim 4, wherein each of the first and the second lateral distances is in a range from about 10 nm to about 16 nm.

6. The semiconductor structure of claim 1, further comprising:
    a work function metal layer over the high-k dielectric layer and wrapping around each of the semiconductor channel layers in the two stacks;
    wherein the gate electrode layer is disposed over the work function metal layer.

7. The semiconductor structure of claim 6, wherein the work function metal layer includes a first work function metal layer over the high-k dielectric layer and wrapping around each of the semiconductor channel layers in one of the two stacks, and wherein the work function metal layer includes a second work function metal layer over the high-k dielectric layer and wrapping around each of the semiconductor channel layers in the other of the two stacks.

8. The semiconductor structure of claim 7, wherein the first work function metal layer includes a p-type work function metal, and wherein the second work function metal layer includes an n-type work function metal.

9. The semiconductor structure of claim 1, further comprising:
an isolation structure, wherein the dummy fin is disposed over the isolation structure.

10. The semiconductor structure of claim 1, wherein the dummy fin includes a high-k dielectric layer disposed over a low-k dielectric layer.

11. A semiconductor structure, comprising:
a substrate;
a dielectric fin disposed over the substrate and between a first active region and a second active region; and
a first semiconductor fin disposed in the first active region, wherein a first plurality of channel layers are disposed above the first semiconductor fin;
wherein a topmost layer of the first plurality of channel layers is the widest layer of the first plurality of channel layers.

12. The semiconductor structure of claim 11, wherein a bottommost layer of the first plurality of channel layers is the narrowest layer of the first plurality of channel layers, and wherein an intermediate layer of the first plurality of channel layers, the intermediate layer disposed between the topmost and bottommost layers, is wider than the bottommost layer and narrower than the topmost layer.

13. The semiconductor structure of claim 11, wherein the dielectric fin and the first semiconductor fin are substantially parallel to each other.

14. The semiconductor structure of claim 11, further comprising:
a gate dielectric layer, wherein a first portion of the gate dielectric layer wraps around each of the first plurality of channel layers, and wherein a second portion of the gate dielectric layer is deposited on sidewalls of the dielectric fin.

15. The semiconductor structure of claim 14, wherein the first portion of the gate dielectric layer wrapping around the topmost layer of the first plurality of channel layers is laterally spaced from the second portion of the gate dielectric layer by a first distance, and wherein the first portion of the gate dielectric layer wrapping around other layers of the first plurality of channel layers is laterally spaced from the second portion of the gate dielectric layer by a second distance greater than the first distance.

16. The semiconductor structure of claim 14, further comprising:
a work function metal layer over the first portion of the gate dielectric layer and wrapping around each of the first plurality of channel layers; and
a gate electrode layer over the work function metal layer.

17. The semiconductor structure of claim 11, further comprising:
a second semiconductor fin disposed in the second active region, wherein a second plurality of channel layers are disposed above the second semiconductor fin;
wherein a topmost layer of the second plurality of channel layers is the widest layer of the second plurality of channel layers.

18. A semiconductor structure, comprising:
a dummy fin disposed over an isolation structure;
a stack of channel layers adjacent to the dummy fin, wherein widths of the channel layers of the stack of channel layers increase as they are further away from an underlying substrate;
a first high-k dielectric portion wrapping around a first channel layer of the stack of channel layers;
a second high-k dielectric portion wrapping around a second channel layer of the stack of channel layers, the second channel layer closer to the underlying substrate than the first channel layer; and
a third high-k dielectric portion disposed on sidewalls of the dummy fin;
wherein a first lateral distance between the first high-k dielectric portion and the third high-k dielectric portion is less than a second lateral distance between the second high-k dielectric portion and the third high-k dielectric portion.

19. The semiconductor structure of claim 18, wherein a topmost layer of the stack of channel layers is wider than other layers of the stack of channel layers.

20. The semiconductor structure of claim 18, further comprising:
a work function metal layer over the first and second high-k dielectric portions and wrapping around each of the first and second channel layers of the stack of channel layers; and
a gate electrode layer over the work function metal layer.

* * * * *